US011646387B2

(12) United States Patent
Lu et al.

(10) Patent No.: US 11,646,387 B2
(45) Date of Patent: May 9, 2023

(54) LASER ASSISTED METALLIZATION PROCESS FOR SOLAR CELL CIRCUIT FORMATION

(71) Applicant: SunPower Corporation, San Jose, CA (US)

(72) Inventors: Pei Hsuan Lu, San Jose, CA (US); Benjamin I. Hsia, Fremont, CA (US); David Aaron Randolph Barkhouse, Oakland, CA (US); David C. Okawa, Redwood City, CA (US); David F. Kavulak, Fremont, CA (US); Lewis C. Abra, San Francisco, CA (US); George G. Correos, Corralitos, CA (US); Richard Hamilton Sewell, Los Altos, CA (US); Ryan Reagan, Hayward, CA (US); Tamir Lance, Los Gatos, CA (US); Thierry Nguyen, San Francisco, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 16/377,074

(22) Filed: Apr. 5, 2019

(65) Prior Publication Data

US 2019/0312166 A1 Oct. 10, 2019

Related U.S. Application Data

(63) Continuation-in-part of application No. 16/376,802, filed on Apr. 5, 2019.

(Continued)

(51) Int. Cl.

*H01L 31/05* (2014.01)
*H01L 31/0224* (2006.01)

(Continued)

(52) U.S. Cl.

CPC .... *H01L 31/0516* (2013.01); *H01L 31/02245* (2013.01); *H01L 31/0682* (2013.01); *H01L 31/182* (2013.01); *H02S 40/34* (2014.12)

(58) Field of Classification Search

CPC ... H01L 31/048; H01L 31/188; H01L 31/186; H01L 31/022441; H01L 31/0465;

(Continued)

(56) References Cited

U.S. PATENT DOCUMENTS

| | | | |
|---|---|---|---|
| 3,993,533 | A | 11/1976 | Milnes et al. |
| 4,023,005 | A | 5/1977 | Bolin |

(Continued)

FOREIGN PATENT DOCUMENTS

| | | |
|---|---|---|
| CN | 102132423 | 7/2011 |
| DE | 10020412 | 11/2001 |

(Continued)

OTHER PUBLICATIONS

Merriam Webster Dictionary definition for Discrete, https://www.merriam-webster.com/dictionary/discrete (Year: 2009).*

(Continued)

*Primary Examiner* — Andrew J Golden

(74) *Attorney, Agent, or Firm* — Schwabe, Williamson & Wyatt, P.C.

(57) ABSTRACT

A method of fabricating solar cell, solar laminate and/or solar module string is provided. The method may include: locating a metal foil over a plurality of semiconductor substrates; exposing the metal foil to laser beam over selected portions of the plurality of semiconductor substrates, wherein exposing the metal foil to the laser beam forms a plurality conductive contact structures having of locally deposited metal portion electrically connecting the metal foil to the semiconductor substrates at the selected portions; and selectively removing portions of the metal foil, (Continued)

187 125 125 125 125 125 125 125 125 125 125 125 125 125 125 wherein remaining portions of the metal foil extend between at least two of the plurality of semiconductor substrates.

20 Claims, 18 Drawing Sheets

Related U.S. Application Data

(60) Provisional application No. 62/773,168, filed on Nov. 29, 2018, provisional application No. 62/773,148, filed on Nov. 29, 2018, provisional application No. 62/773,172, filed on Nov. 29, 2018, provisional application No. 62/654,198, filed on Apr. 6, 2018.

(51) Int. Cl.
*H02S 40/34* (2014.01)
*H01L 31/18* (2006.01)
*H01L 31/068* (2012.01)

(58) Field of Classification Search
CPC ... H01L 31/05-0516; H01L 31/022433; H01L 31/02245; H01L 31/0682; H01L 31/182; H02S 40/34
USPC .................................................. 136/243-265
See application file for complete search history.

(56) References Cited

U.S. PATENT DOCUMENTS 4,058,418 A 11/1977 Lindmayer
4,318,938 A 3/1982 Barnett et al.
4,393,576 A 7/1983 Dahlberg
4,400,577 A 8/1983 Spear
4,433,200 A 2/1984 Jester et al.
4,461,922 A 7/1984 Gay et al.
4,482,780 A 11/1984 Mitchell
4,581,103 A 4/1986 Levine et al.
4,582,588 A 4/1986 Jensen et al.
4,617,421 A 10/1986 Nath et al.
4,691,076 A 9/1987 Levine et al.
4,695,674 A 9/1987 Bar-on
4,697,041 A 9/1987 Okaniwa et al.
4,882,298 A 11/1989 Moeller et al.
4,917,752 A 4/1990 Jensen et al.
4,957,601 A 9/1990 Levine et al.
5,091,319 A 2/1992 Hotchkiss et al.
5,380,371 A 1/1995 Murakami
5,951,786 A 9/1999 Gee et al.
5,980,679 A 11/1999 Severin et al.
6,159,832 A 12/2000 Mayer
6,288,326 B1 9/2001 Hayashi et al.
6,448,155 B1 9/2002 Iwasaki et al.
6,635,307 B2 10/2003 Huang et al.
7,355,114 B2 4/2008 Ojima et al.
7,687,334 B2 3/2010 Zou et al.
8,003,530 B2 8/2011 Grohe et al.
8,146,643 B2 4/2012 Kasahara et al.
8,809,192 B2 8/2014 Bertram et al.
9,040,409 B2 5/2015 Kumar et al.
9,620,661 B2 4/2017 Kim et al.
2001/0029976 A1 10/2001 Takeyama et al.
2002/0159740 A1 10/2002 Beall et al.
2005/0253142 A1 11/2005 Negami et al.
2006/0166023 A1 7/2006 Yoshikata et al.
2006/0213548 A1 9/2006 Bachrach
2008/0042153 A1 2/2008 Beeson et al.
2008/0053511 A1 3/2008 Nakamura
2008/0128019 A1 6/2008 Lopatin et al.
2008/0216887 A1 9/2008 Hacke et al.
2008/0223429 A1 9/2008 Everett et al.
2009/0194162 A1 8/2009 Sivaram et al.
2009/0266399 A1 10/2009 Bulent et al.
2009/0305076 A1 12/2009 Wong et al.
2009/0314344 A1 12/2009 Fork et al.
2010/0032013 A1 2/2010 Krause et al.
2010/0051085 A1* 3/2010 Weidman .......... H01L 31/02245 136/244
2010/0084748 A1 4/2010 Poddar et al.
2010/0200058 A1 8/2010 Funakoshi
2010/0243041 A1 9/2010 Carlson et al.
2010/0275965 A1 11/2010 Lee et al.
2011/0073165 A1 3/2011 Lee
2011/0076847 A1 3/2011 Aqui et al.
2011/0120752 A1 5/2011 Imai et al.
2011/0136265 A1 6/2011 Shigenobu et al.
2011/0186117 A1 8/2011 Kumar et al.
2012/0097245 A1 4/2012 Nishina et al.
2012/0103408 A1 5/2012 Moslehi et al.
2012/0234388 A1* 9/2012 Stancel ............... H01L 31/0504 136/259
2012/0240995 A1* 9/2012 Coakley ............. H01L 31/0516 136/256
2013/0068287 A1 3/2013 Compaan
2013/0112233 A1 5/2013 Coakley
2013/0160825 A1 6/2013 Lantzer et al.
2013/0183796 A1 7/2013 Stewart et al.
2013/0247977 A1 9/2013 Kumai et al.
2014/0113400 A1 4/2014 Takahashi
2014/0190546 A1 7/2014 Fukumochi et al.
2014/0338739 A1 11/2014 Liu et al.
2015/0004737 A1* 1/2015 Harley ................. H01L 31/048 438/64
2015/0090329 A1* 4/2015 Pass ................ H01L 31/022441 136/256
2015/0129031 A1* 5/2015 Moslehi .......... H01L 31/022441 136/256
2015/0325710 A1 11/2015 Tu
2016/0020343 A1 1/2016 Carlson
2016/0133759 A1 5/2016 Pass et al.
2016/0181447 A1 6/2016 Kim et al.
2017/0062633 A1* 3/2017 Carlson ........... H01L 31/022441
2017/0179312 A1 6/2017 Kim et al.
2017/0250297 A1 8/2017 Harley
2017/0365731 A1 12/2017 Lin et al.
2018/0097129 A1 4/2018 Pass

FOREIGN PATENT DOCUMENTS

EP 1634673 3/2006
JP 2003/246971 9/2003
JP 2009/130116 6/2009
JP 2011/054831 3/2011
JP 2012/501551 1/2012
KR 10-1267398 1/2013
KR 20130005727 A 1/2013
TW 2010/27773 7/2010
WO WO 1999/040760 8/1999
WO WO 2010/025269 3/2010
WO WO 2013/142892 10/2013
WO 2014023668 A1 2/2014
WO WO-2014023668 A1 * 2/2014 ..... H01L 31/022425
WO 2016036224 A1 3/2016
WO WO 2016-036224 3/2016

OTHER PUBLICATIONS

WO 2014023668A1 English machine translation (Year: 2014).*
Cotter, et al., "Novel Process for Simplified Buried Contact Solar Ceils," Institute of Electrical and Electronics Engineers, Aug. 2000, pp. 303-306.
Lu, et al., "Laser-Doping through Anodic Aluminum Oxide Layers for Silicon Solar Cells," Journal of Nanomaterials, vol. 2015, Article ID 870839, Jul. 1, 2015, 6 pages.
Nekarda, et al., "Laser-Based Foil Metallization for Industrial Perc Solar Cells," Presented at the 28$^{th}$ European Photovoltaic Solar Energy Conference and Exhibition; Paris, Sep. 30-Oct. 2013, 3 pgs.
Graf, et al., "Foil Metallization Process for Perc Solar Cells Towards Industrial Feasibility," Presented at the 31$^{st}$ European PV Solar Energy Conference and Exhibition, Sep. 14-18, 2015, Hamburg, Germany, 4 pgs.

(56) References Cited

OTHER PUBLICATIONS

Schulte-Huxel, et al., "Al-Foil on Encapsulant for the Interconnection of Al-Metalized Silicon Solar Cells," Article in IEEE Journal of Photovoltaics—Jan. 2013, 7 pgs.
Schulte-Huxel, et al., "Laser microwelding of thin Al layers for interconnection of crystalline Si solar cells: analysis of process limits for ns and µs lasers," Article in Journal of Photonics for Energy—Aug. 2014, 15 pgs.
Schulte-Huxel, et al., "Aluminum-Based Mechanical and Electrical Laser Interconnection Process for Module Integration of Silicon Solar Cells," in IEEE Journal of Photovoltaics, vol. 2, No. 1, pp. 16-21, Jan. 2012, 6 pgs.
International Search Report and Written Opinion from PCT/US2019/026188) dated Jul. 25, 2019, 12 pgs.
Non-final Notice of Reasons for Rejection from Japanese Patent Application No. 2018-182848 dated Oct. 16, 2019, 7 pgs.
International Preliminary Report on Patentability from PCT/US2019/026188 dated Oct. 15, 2020, 9 pgs.
Roder et al., 30 µm Wide Contacts on Silicon Cells by Laser Transfer, 2010, 35th IEEE Photovoltaic Specialists Conference,Honolulu, HI, USA, 2010, pp. 003597-003599 (Year: 2010).
Pre-Interview First Office Action from U.S. Appl. No. 16/377,053 dated Nov. 12, 2020; 16 pgs.
FAI Office Action from U.S. Appl. No. 16/377,053 dated Feb. 16, 2021; 5 pgs.
Final Office Action from U.S. Appl. No. 16/377,053 dated Aug. 21, 2021; 18 pgs.
International Preliminary Report on Patentability from PCT/US2019/026186 dated Oct. 15, 2020; 9 pgs.
International Search Report and Written Opinion from PCT/US2019/026186 dated Jul. 25, 2019; 12 pgs.
International Preliminary Report on Patentability from PCT/US2019/026190 dated Oct. 15, 2020; 6 pgs.
International Search Report and Written Opinion from PCT/US2019/026190 dated Sep. 22, 2020; 9 pgs.
FAI Office Action from U.S. Appl. No. 16/376,802 dated Mar. 23, 2020; 5 pgs.
Pre-Interview First Office Action from U.S. Appl. No. 16/376,802 dated Dec. 2, 2019; 13 pgs.
Final Office Action from U.S. Appl. No. 16/376,802 dated Oct. 14, 2020; 18 pgs.
Non-Final Office Action from U.S. Appl. No. 16/376,802 dated Mar. 3, 2021; 24 pgs.
International Preliminary Report on Patentability from PCT/US2019/026151 dated Oct. 15, 2020; 9 pgs.
International Search Report and Written Opinion from PCT/US2019/026151 dated Jul. 31, 2019; 12 pgs.
FAI Office Action from U.S. Appl. No. 16/377,000 dated Jun. 8, 2020; 5 pgs.
Pre-Interview First Office Action from U.S. Appl. No. 16/377,000 dated Mar. 2, 2020; 13 pgs.
Final Office Action from U.S. Appl. No. 16/377,000 dated Oct. 27, 2020; 20 pgs.
Non-Final Office Action from U.S. Appl. No. 16/377,000 dated Apr. 28, 2021; 23 pgs.
Extended European Search Report from European Patent Application No. 19782324.8 dated Apr. 7, 2021; 14 pgs.
International Preliminary Report on Patentability from PCT/US2019/026166 dated Oct. 15, 2020; 9 pgs.
International Search Report and Written Opinion from PCT/US2019/026166 dated Aug. 2, 2019; 12 pgs.
International Preliminary Report on Patentability from PCT/US2019/026189 dated Oct. 15, 2020; 8 pgs.
International Search Report and Written Opinion from PCT/US2019/026189 dated Jul. 25, 2019; 11 pgs.
FAI Office Action from U.S. Appl. No. 16/377,102 dated Mar. 23, 2020; 7 pgs.
Pre-Interview First Office Action from U.S. Appl. No. 16/377,102 dated Dec. 20, 2019; 12 pgs.
Final Office Action from U.S. Appl. No. 16/377,102 dated Oct. 14, 2020; 20 pgs.
Non-Final Office Action from U.S. Appl. No. 16/377,102 dated Mar. 3, 2021; 21 pgs.
Extended European Search Report from European Patent Application No. 19781261.3 dated Mar. 31, 2021; 13 pgs.

* cited by examiner

LASER ASSISTED METALLIZATION PROCESS FOR SOLAR CELL CIRCUIT FORMATION

CROSS-REFERENCE TO RELATED APPLICATIONS

This application claims the right of priority to and benefit of earlier filing date of U.S. Provisional Application No. 62/773,172, filed on Nov. 29, 2018, U.S. Provisional Application No. 62/773,168, filed on Nov. 29, 2018, U.S. Provisional Application No. 62/773,148, filed on Nov. 29, 2018, and U.S. Provisional Application No. 62/654,198, filed on Apr. 6, 2018, each of which is hereby incorporated by reference herein in its entirety. This application also claims the right of priority to and benefit of earlier filing of U.S. patent application Ser. No. 16/376,802, filed Apr. 5, 2019, titled "Local Metallization for Semiconductor Substrates using a Laser Beam," SunPower Ref. No. 52040US, which is hereby incorporated by reference in its entirety.

TECHNICAL FIELD

Embodiments of the present disclosure are in the field of renewable energy or semiconductor processing and, in particular, include metallization of semiconductor substrates using a laser beam, and the resulting structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIGS. 1A-1F illustrate views of various stages in a metallization and stringing method for solar cells, wherein:

FIG. 1A illustrates an isometric view of adjacent solar cells being arranged to form a solar cell array or circuit that are to be stringed and/or arrayed together;

FIG. 1B illustrates an isometric view of the arranged solar cells of FIG. 1A following their positioning to form the array or circuit;

FIG. 1C illustrates an isometric view of the arranged solar cells of FIG. 1B and the provision of the metal foil used to connect the arranged solar cells in the array or circuit;

FIG. 1D illustrates an isometric view of the arranged solar cells of FIG. 1C following placement of the metal foil on the solar cells;

FIG. 1E illustrates an isometric view of the arranged solar cells of FIG. 1D showing the subjection of the metal foil to a laser beam;

FIG. 1F illustrates an isometric view of the arranged solar cells of FIG. 1E showing the removal of some portions of the metal foil to form a solar cell array or to form a solar cell circuit.

DETAILED DESCRIPTION

Figure 1A:
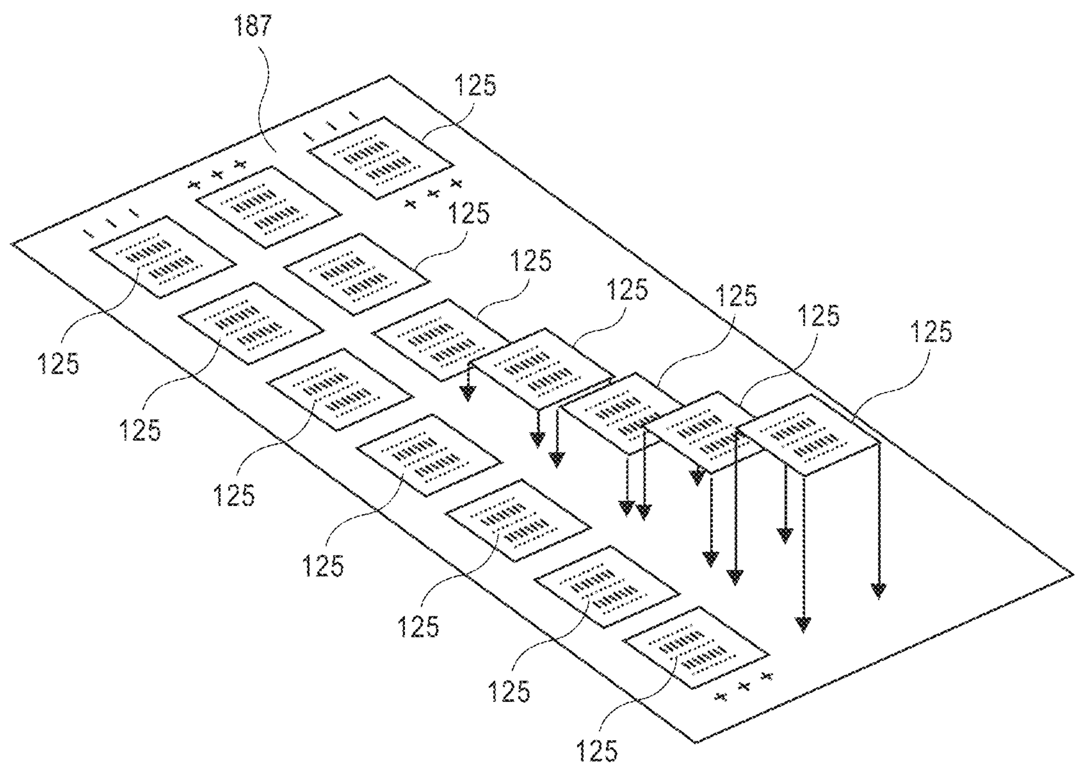

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx) silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 1 nanometers (nm) to 20 microns (μm), a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein. A substrate also can be glass, a layer of polymer or another material.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

As described in further detail below, aspects of this disclosure relate to increased solar cell conversion efficiency and/or lower manufacturing costs by providing novel processes for fabricating solar cell structures.

Stringing and local metallization of semiconductor substrates using a laser beam, and the resulting structures, e.g., micro-electronic devices, semiconductor substrates, solar cells, strings of solar cells, and/or solar cell arrays, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be appreciated that the various embodiments shown in the figures are illustrative representations and are not necessarily drawn to scale.

Disclosed herein are methods of fabricating strings of solar cells and higher order structures, such as solar cell arrays and/or solar cells circuits. In an embodiment, a solar cell can include a front side, which faces the sun during normal operation and a backside opposite the front side. A method of fabricating a solar cell circuit involves arranging a plurality (such as two or more) of semiconductor substrates as an unconnected arrangement that corresponds to the final layout of a solar cell string, circuit and/or array. For example, the semiconductor substrates can be arranged such that when electrically connected they would form parallel solar cell circuits, such as parallel strings of solar cells. In another example, the semiconductor substrates can be arranged such that when electrically connected they would form serially connected solar cell circuits, such as strings of solar cells connected in series. In other examples they would form some combination of serial and parallel connected solar cells. As detailed below, other electric components, such as diodes and junction boxes can be integrated into the solar cell circuits.

A metal foil can be located over the plurality of semiconductor substrates such that the metal foil is in contact with a backside, a front side or both a backside and a front side of the plurality of semiconductor substrates. In an example, the metal foil extends between two or more semiconductor substrates, such that it can span gaps or spaces between the plurality of semiconductor substrates. The metal foil can be exposed to a laser beam in locations over the semiconductor regions of the plurality of semiconductor substrates, such as selected edges of the plurality of semiconductor substrates. Exposing the metal foil to the laser beam can form a plurality of conductive contact structures electrically connected to the semiconductor regions, which electrically connect the metal foil to the semiconductor substrates. These conductive contact structures can include a locally deposited metal portion. In an embodiment, the semiconductor substrates can include one or more contact pads and the one or more locally deposited metal portions which electrically connect the metal foil connect to the one or more contact pads on the semiconductor substrates.

To provide context, the ability to connect two or more solar cells using an inexpensive metal foil in a single operation process represents a significant cost advantage over competing technologies. According to embodiments, the metal foil is used to electrically connect solar cells, such as back contact and/or front contact solar cells, together instead of patterned cell interconnects that can be individually attached to the solar cells. To further provide context, techniques for stringing together back-contact solar cells can be different than techniques for stringing together front-contact cells. In an example, for back-contact cells, metal fingers for each polarity (N and P) can be connected to a single busbar at the edge of the cell. Cell interconnects can then be soldered from the "P busbar" (e.g., the busbar connected to the metal finger for a given P-type region) of one cell to the "N busbar" (e.g., the busbar connected to the metal finger for a given N-type region) of the next solar cell. Stringing together front-contact solar cells (in contrast to some embodiments described herein, which include methods for stringing together back-contact solar cells) may involve the use of metal ribbons weaving from the back side of one cell to the front side of the next cell. In other words, between two front contact cells, a ribbon can go underneath one cell and across the top of another adjacent cell (e.g., the next cell). Weaving from front to back for front-contact cells can pose manufacturing difficulties (e.g., alignment difficulties, etc.). The disclosed technique can greatly simplify the task of electrically connecting multiple solar cells together, e.g., in contrast to individually coupling an interconnect to pairs of connected solar cells. In an embodiment, the metal foil can serve as metallization to collect current across the cells, either by themselves, or in conjunction with a first level metallization on the solar cells.

An exemplary aluminum (Al) metal foil has a thickness approximately in the range of 1-100 μm, for example in the range of 1-15 μm, 5-30 μm, 15-40 μm, 25-50 μm 30-75 μm, or 50-100 μm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys. An exemplary metal foil is a continuous sheet of metal that can cover a plurality of semiconductor substrates, and in some examples extend past all of the edges of the s plurality of semiconductor substrates.

The metal foil can include different pattern configurations. For example, the metal foil extending between the selected edges of the semiconductor substrates can include stress relief features. In other examples, the metal foil can include information, such as a 2D bar code for solar cell and/or string level tracking, alignment, etc. The metal foil can include patterns, such as interdigitated patterns, fishbone patterns, etc, and textures, such as corrugation and a pretexture for uni-directional strength.

A locating process can be performed to position or secure the metal foil to the semiconductor substrates using a vacuum and/or a tacking process to hold the metal foil in place over/on the substrate(s). The locating process can include thermocompression, where a roller and/or heat can be used to position or locate the metal foil over the substrate. A vacuum process, thermocompression process or other similar process can also be used to uniformly position the metal foil and inhibit air gaps or air pockets between the metal foil and the substrate.

Exposing the metal foil to laser beam in selected locations over the plurality of semiconductor substrates can include patterning a solar cell string, circuit or array. By patterning of the metal foil, an electrically connected circuit can be formed. Thus, one or more embodiments described herein are directed to metallization, stringing, and circuit construction techniques. The methods used herein can be used to fabricate the solar cell metallization structures, e.g., solar cell strings, solar cell circuits, solar cell metallization matrix, which are part of a solar laminate, a solar module, and/or a flexible type solar panel. The methods used can include the formation of solar cell metallization structures of a solar laminate, solar module, and/or a flexible type solar laminate, solar panel or solar module.

Some metal portions can be removed, for example portions of the metal foil. In an example, the metal foil between the plurality of semiconductor substrates that are not electrically connected to another semiconductor substrate can be removed to prevent shorting between adjacent, or even other, non-adjacent semiconductor substrates in the circuit. There is some metal foil left behind that extends between two or more of the semiconductor substrates. In an example, the metal foil can be left behind that extends between two or more selected edges of the semiconductor substrates. In an example, the method includes selectively removing the metal foil from the plurality of semiconductor substrates that are not electrically connected to the selected edges. In an embodiment, subsequent to exposing the metal foil to the laser beam, the method can include removing at least a portion of the metal foil. In an example, subsequent to exposing the metal foil to the laser beam, the method can include removing at least a portion of the metal foil not exposed to the laser beam. The metal foil can have an edge feature, such as an edge feature formed by physically separating or breaking the metal foil. In an embodiment, the metal foil left behind that extends between two or more of the semiconductor substrates can have an edge feature, for example as formed when the non-laser exposed portions of the foil are removed. In an example, non-locally deposited portions of the metal foil are removed, which can result in the locally deposited portions of the metal foil having an edge feature, such as an edge feature formed by physically separating, breaking or tearing the bulk metal foil that was not subjected to a LAMP technique, from the portions of the metal foil that are deposited on the substrate. The edge feature can include a torn edge or a sharp torn edge. In an example, first portions of the metal (aluminum foil in this example) are deposited or directly secured to the surface of the solar cell by a LAMP technique, whereas second portions (which are adjacent to the first portions) of the metal are not subjected to a LAMP technique and are not deposited or directly secured to the surface of the solar cell. The first and second portions of the metal foil are attached to each other, and a region therebetween can be patterned to weaken this region, preferably the same LAMP technique in a same process step that deposited the first portions. The second portions are removed and physically separated or torn away from the first portions, resulting in an edge structure along sides of the first portions. This edge structure or feature can be sharp and/or torn in appearance, and is differentiated from a round or curved edge of a metallization feature left behind from welding, soldering, plating or other depositions of metal to a substrate. The edge structures can also be polished to remove sharp or rough features in a subsequent step.

Additional electronics can be connected to the solar cell circuits, for example bypass diodes, junction boxes, busbars, and the like. In an example, the method includes arranging one or more junction boxes in the solar cell array or solar cell circuit and connecting the one or more junction boxes to the metal foil. In an example, the method includes arranging one or more bypass diodes in the circuit and connecting the one or more bypass diodes to the metal foil.

Within the context of forming solar cell arrays or circuits, the solar cells themselves may also be fabricated, for example while arranged as a solar cell circuit, array and or a solar cell string. In one embodiment, a method of forming solar cell circuits includes forming semiconductor regions in or above a substrate and patterning the metal foil in locations over the semiconductor regions (these regions being distinct from those connecting adjacent, or non-adjacent semiconductor substrates). In an embodiment, the formation of semiconductor regions is done prior to the arrangement of the semiconductor substrates for circuit formation. The patterning can form a plurality of conductive contact structures electrically connected to the semiconductor regions, each conductive contact structure including a locally deposited metal portion and removing non-patterned portions of the metal foil. In an embodiment, the metal foil can be exposed to a laser beam in locations over the semiconductor regions, wherein exposing the metal foil to the laser beam forms a plurality of conductive contact structures electrically connected to the semiconductor regions, each conductive contact structure including a locally deposited metal portion. The method can include forming semiconductor regions in or above a substrate. The metal foil can be exposed to a laser beam in locations over, partially over, offset from and/or adjacent to the openings in the intervening layer. Exposing the metal foil to the laser beam forms a plurality of conductive contact structures electrically connected to the underlying regions of the substrate. Each conductive contact structure includes a locally deposited metal portion that is in electrical connection with the substrate. In a back contact example, the conductive contact structures are located on a back side, whereas a front contact example has conductive contact structures located on both front and back sides. LAMP techniques can be used for one or both of the sides. The intervening layer can be formed to cover the entire front and/or back surface of the substrate, on and/or above the substrate.

In an exemplary embodiment, a layer or a sheet of a metal foil can be placed on a surface of a solar cell(s) for both metal deposition and/or patterning and circuit formation, which can be performed in a single process. In accordance with one or more embodiments of the present disclosure, a metal for a conductor contact can be effectively deposited and patterned in a same operation. In one embodiment, a metal foil can be placed over a surface of a solar cell. Portions of the metal foil can be exposed to a laser beam to create localized heat for metal deposition while patterning the source metal foil layer. After deposition and patterning, the source of the metal layer, e.g., portions can be removed. In an example, portions of a metal foil not exposed to the laser beam can be removed. In one example, portions of the meal foil exposed to the laser beam can also be removed. In a further example, portions of the metal foil exposed to another laser beam and/or exposed to a laser having different properties (e.g., power, frequency, etc.) can also be removed.

In another example, an operation to form metal and pattern a metal layer for a semiconductor device (e.g., a solar cell) can include first forming a first metal layer on a substrate (e.g., a metal seed layer) via conventional or LAMP techniques, locating a second metal layer (such as an aluminum foil) over the first metal layer, and bonding portions of the first metal layer to the second metal layer, e.g., using a laser. The metal seed layer can include a layer of deposited tin, tungsten, titanium, copper, and/or aluminum. A sputtering process can be used to deposit the metal seed layer. The metal seed layer can have a thickness in a range of 0.05 to 50 microns.

Stringing and local metallization of substrates, for example semiconductor substrates, using a laser beam, and the resulting structures, are described herein. In accordance with one or more embodiments of the present disclosure, a metal for a conductive contact structure is effectively deposited and patterned in a same operation. In one embodiment, a metal foil is placed over a surface of a substrate, such as a semiconductor solar cell. Portions of the metal foil are exposed to a laser beam to create localized heat for localized metal deposition while patterning the source metal foil layer. After deposition and patterning, the source of the metal layer, e.g., portions of a metal foil not exposed to the laser beam, can be removed. Not to be bound by theory, the above described localized metal deposition achieved by exposing a metal foil to a laser beam may be achieved by partial or full melt of the laser exposed/scribed/irradiated portions of the metal foil, by partial or full ablation of portions of the metal foil with subsequent re-deposition onto the wafer surface, and/or by laser sputtering of portions of a metal foil during laser patterning of the metal foil. Generally, first portions of the metal foil may be exposed to a laser beam to create localized heat for metal deposition from the metal foil (e.g., using the metal foil as a source) while patterning the source metal foil layer at the same time. Additionally, certain implementations result in these first portions of the metal foil being fully or at least partially connected to adjacent second portions of the metal foil that have not been exposed to laser irradiation.

To further provide context, in typically operation in order to deposit metal and pattern a metal layer several operations are performed, which may include use of a vacuum chamber for deposition or a chemical bath for plating. One or more patterning operations is then typically performed to identify regions where a deposited metal needs to be removed. By contrast, in accordance with one or more embodiments herein, the disclosed metallization approach effectively achieves metal deposition and patterning in a single process operation. Advantages of implementing embodiments described herein may include less costly and faster metallization than using optical lithography (and omission of an associated etch process), and potentially more precise patterning with smaller feature width and higher aspect ratio compared to screen printing. The ability to directly deposit patterned metal using an inexpensive foil in a single operation process represents a significant cost advantage over competing technologies and, possibly, may enable the fabrication of relatively smaller features. For the latter advantage, tighter pitch and higher efficiency may be achieved as compared with structures typically formed using screen printing. In an example, screen printed conductive contacts can include silver paste having a thickness of up to 50 microns and a minimum feature size of 50 microns. In contrast, LAMP techniques can result in a thickness of approximately 1 nanometers to 20 microns and a minimum feature size of approximately 25 microns. The deposition thickness can be controlled by the starting thickness of the source material and the laser conditions. The deposited thickness can range from about 5% to about 25% of the source material thickness. The thickness of the source material partially constrains the laser conditions (in particular, the pulse duration) required for LAMP. The thickness of the source material partially constrains the laser conditions (in particular, the pulse duration) required for LAMP. In one embodiment, a metal source material can have a thickness in a range of approximately 1 nm to 1 μm. In an example, performing laser assisted metallization process (LAMP) can include sputtering metal from a thin source material onto a thin polymer or membrane using a picosecond laser or a femtosecond laser, where the thin source material can have a thickness in a range of approximately 1 nm to 1 μm. In an embodiment, the metal source material can have a thickness in a range of 1 μm to 100 μm, such as 1 μm to 10 μm, 5 μm to 25 μm, 10 μm to 50 μm, 25 μm to 75 μm, or 50 μm to 100 μm. In an example, performing laser assisted metallization process (LAMP) can include sputtering metal from a metal foil onto a substrate using a picosecond laser or a femtosecond laser, where the metal foil can have a thickness in a range of approximately 1 μm to 100 μm. In various implementations of the LAMP techniques disclose parameters for pre- and post-LAMP metal thickness are as described in Table 1.

TABLE 1

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Target Thickness Examples | 10-50 μm | 1-10 μm in LAMP region<br>1-20 μm in LAMP region<br>10-50 μm or original thickness in non-LAMP region | 1-10 μm for initial LAMP layer<br>1-20 μm for initial LAMP layer<br>10-50 μm for additionally bonded layers<br>20-200 μm for additionally bonded layers | 10-50 μm<br>25-45 μm<br>25-200 μm<br>10-220 μm |
| Practical Minimum Thickness Examples | 1 μm | 60 nm<br>100 nm | 100 nm<br>1 μm | 100 nm |
| Practical Maximum Thickness Examples | 100 μm | 12 μm<br>20 μm | 20 μm<br>200 μm | N/A |

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity. In addition to the examples of Table 1, in various examples utilizing aluminum as a metal foil, the solar cell can have a layer (or layers) of aluminum with a thickness of approximately 1 nm-500 μm. The metal foil can include aluminum in an amount greater than approximately 97% and silicon in an amount approximately in the range of 0-2%.

In an example, the power, wavelength and/or pulse duration of a laser for a LAMP technique are selected so as to form a plurality of locally deposited metal portions, but not to fully ablate the foil. The power, wavelength and/or pulse duration can be selected/tuned based on the metal foil composition, melting temperature and/or thickness. In an example, the laser has a wavelength of between about 250 nm and about 2000 nm (such as wavelength of 250 nm to 300 nm, 275 nm to 400 nm, 300 nm to 500 nm, 400 nm to 750 nm, 500 nm to 1000 nm, 750 nm to 1500 nm, or 1000 nm to 2000 nm), the laser peak power is above $5\times10^{+4}$ W/mm$^2$, and the laser is a pulse laser with a pulse frequency of about 1 kHz and about 10 MHz (such as about 1 kHz and about 10 MHz, such a 1 kHz to 1000 kHz, 500 kHz to 2000 kHz, 1000 kHz to 5000 kHz, 2000 kHz to 7500 kHz, or 5000 kHz to 10 mHz. The pulse duration can be between 1 fs to 1 ms, such as 1 fs to 250 fs, 100 fs to 500 fs, 250 fs to 750 fs, 500 fs to 1 ns, 750 fs to 100 ns, 1 ns to 250 ns, 100 ns to 500 ns, 250 ns to 750 ns, 500 ns to 1000 ns, 750 ns to 1500 ns, 1000 ns to 5000 ns, 1500 ns to 10000 ns, 5000 ns to 100000 ns, 10000 ns to 500000 ns, and 100000 to 1 ms. The laser can be an IR, Green or a UV laser. In certain examples, the laser beam has a width of between about 20 μm and about 50 μm, such as 20-30 μm, 25-40 μm, and 30-50 μm.

Exposing foil to a laser beam can also form other features that are unique when compared to conventional metallization approaches, including forming a "U-shaped" structure or valley where the laser beam has contacted the foil. The width of the "U-shaped" is approximately equal to the width of the laser beam used. In an embodiment, the conductive contact structures are connected, at least temporarily until the removal of the regions not exposed to the laser beam, by edge portions that extend from the conductive contact structure to regions of the metal foil not exposed to the laser beam In an example, exposing the metal foil to the laser beam forms a spatter or sputter feature on the solar cell, for example on the foil and/or substrate. Such a spatter feature can be used to determine if the solar cell was formed using a LAMP technique. In some examples, the spatter feature can be removed from at least the metal foil, for example, to facilitate bonding of a second material to the foil, such as a carrier sheet used to remove the foil that has not been exposed to the laser beam, or other components of a solar cell, solar cell string, or higher order structure, such as an interconnect, foil extending from another cell, or other electrically or non-electrically connected component of a solar cell, solar cell string, or higher order structure. Such spatter can be removed by polishing or etching.

Laser assisted metallization can be repeated to build up a multi-layer metal foil structure for purposes of increases metal thickness (e.g., for conductivity or structural purposes) and to facilitate removal of non-deposited portions of a first metal foil layer. Specifically, a second metal source, such as a metal foil, wire, or tape can be located over a first metal foil, where the second metal source is subjected to a laser beam in selected locations over positions of the first metal foil that are not locally deposited (i.e., directly electrically connected) to semiconductor regions, thereby welding or bonding the second metal source to the first metal foil. Subsequent mechanical removal of the second metal source thereby selectively removes regions of the first metal foil that are not locally deposited to semiconductor regions on the substrate.

Additionally, the second metal source is used to provide additional metallization thickness to an entire or portions of a solar cell, such as for the construction of busbars where additional metal thickness is beneficial for electric conduction. Here, the second metal source can be bonded to the first metal foil, via a laser, at the same or approximately the same positions that the first metal foil is locally deposited to the semiconductor regions. This process can be restricted to interconnection regions between adjacent solar cells or applies across a string of adjacent solar cells.

Additionally, the second metal source is located over the solar cell substrate which includes regions or portion of localized metallization, such as formed from a first metal foil or by conventional metallization techniques. The second metal source is bonded to the localized metallization in selected regions to provide additional metallization in these selected regions. In an example, the second metal source is patterned to both increase metal thickness in some regions and to be used as a carrier sheet to remove non-locally deposited portions of the first metal foil in other regions. A tacking process can be used to bond a second metal source to a first metal foil. A tacking process involves forming an array of point or spot welds, which can be performed using a laser, thermocompression bonding (e.g., by using spikes, a spiked roller, a porcupine roller, or a bed of nails), or conventional soldering and welding techniques. The second metal source can also be bonded to the first foil using an electrically conductive adhesive. In another embodiment, the carrier is a plastic, polymer, and/or membrane, that can be used as an insulator, moisture barrier, protection layer and the like.

The semiconductor substrates can include semiconductor regions, for example a plurality of doped regions, e.g., a first doped region, a second doped region, etc. In an example, the semiconductor substrates include a plurality of N-type and P-type semiconductor regions. In some examples, the N-type and P-type semiconductor regions are alternating N-type and P-type semiconductor regions, e.g., placed one after another or occurring repeatedly, for example as interdigitated fingers. In certain embodiments, the plurality of N-type and P-type semiconductor regions are in or above the semiconductor substrate. In an embodiment, the semiconductor regions can be located on the front side, the back side of the semiconductor substrate or a combination thereof. In an example, the N-type or P-type semiconductor regions can be in or above the substrate or both.

In an embodiment, the substrate can have a plurality of doped regions. In an embodiment, the plurality of doped regions can be referred to as a first doped region, a second doped region, etc. In an example, the first doped region can include an N-type semiconductor region and the second doped region can include a P-type semiconductor region. In an example, the substrate can include a plurality of N-type and P-type semiconductor regions. In some embodiments, the N-type and P-type semiconductor regions can be alternating N-type and P-type semiconductor regions. In an embodiment, the alternating N-type and P-type semiconductor regions can be placed one after another or occurring repeatedly, e.g., as interdigitated fingers.

In embodiments, methods described herein can include forming a plurality of N-type and P-type semiconductor regions in or above a substrate. Also, in an example, a method of fabricating a solar cell can include forming a plurality of N-type or P-type semiconductor regions in or above one side of the substrate. In an embodiment, the method can include placing N-type and P-type semiconductor regions on the front side, the back side of the substrate or on both.

Metallization approaches described herein may be applicable for interdigitated back contact (IBC) solar cells as well as other types of solar cells including continuous emitter back contact solar, front and/or back contact solar cells having a trench architecture, e.g. were the n-type and p-type doped regions are separated by a trench structure thin-film, Heterojunction with Intrinsic Thin layer (HIT) Solar cells, Tunnel Oxide Passivated Contact (TOPCon) Solar Cells, organic and front-contact solar cells, front contact cells having overlapping cell sections, Passivated Emitter and Rear Cell (PERC) solar cells, mono-PERC solar cells, Passivated Emitter with Rear Locally-Diffused (PERL) cells, 3 or 4 terminal tandem cells, laminates and other types of solar cells. The metallization approaches described herein may be applicable for solar cells having a plurality of subcells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove.

The metallization approaches described herein may be applicable for solar cells having a plurality of sub-cells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove.

The metallization approaches described herein can also be applied to solar cells and/or solar cell portions which have been singulated and/or physically separated, e.g., diced, partially diced and further separated. In an example, these solar cells and/or solar cell portions can be joined together, either physically and/or electrically, by the metallization structures and processes described herein.

Disclosed herein are strings of solar cells and higher order structures, such as solar cell arrays and solar cells circuits. In one embodiment, a solar cells circuit of solar cells includes a plurality of semiconductor substrates, such as back-contact solar cells. In one embodiment, a string of solar cells includes a plurality of, such as two or more, solar cells.

A solar cell circuit includes a metal foil extending between at least a first semiconductor substrate selected from the plurality of the semiconductor substrates and a second semiconductor substrate selected from the plurality of the semiconductor substrates. The solar cell circuit further includes one or more laser assisted metallization conductive contact structures electrically connecting the metal foil to the first semiconductor substrate and one or more laser assisted metallization conductive contact structures electrically connecting the metal foil to a second semiconductor substrate on either side of the metal foil extending between the two semiconductor substrates. In an embodiment, each conductive contact structure includes a locally deposited metal portion. The solar cell strings can be arranged as a series circuit parallel circuit, or a combination of series and parallel circuits. In an example, the plurality of semiconductor substrates are arranged as matrix or array of solar cell strings. A plurality of solar cell strings connected together, e.g., electrically and mechanically connected, can be also referred to as a solar cell array, a solar cell circuit and/or a solar cell matrix. In an embodiment, at least a portion of the plurality of semiconductor substrates are arranged as a string of solar cells. In an embodiment, the at least a portion of the plurality of semiconductor substrates are arranged as an array of solar cell strings. The metal foil between the solar cells provides for flexible solar cell arrays, which may facilitate packaging, unpackaging, assembling, connecting, installing, and maintaining solar cell modules. These modules may comprise a single array of solar cell cells as well as a plurality of solar cell arrays.

A solar cell string or array can include a non-conducting material disposed on a portion of the metal foil. The non-conducting material can be any non-conductive material, such as, a non-conductive tape or other suitable non-conductive shield or cover. The insulating material may serve to hide the metal foil when viewed from above, for example when viewed from the front side of the solar cell circuit. Thus, the non-conductive shield may cover exposed sections of the metal foil between each adjacent solar cell, for example in a plurality of solar cells. Therefore, according to embodiments, the insulating material includes a material that is substantially opaque to sufficiently cloak the metal foil when viewed from the front. The insulating material may also assist in holding the solar cells together. The insulating material may include materials such as polypropylene or polyethylene, and can further include an adhesive layer like an acrylate. An insulating material with an adhesive layer can be beneficial to assist in alignment. Although an insulating material may be beneficial for the reasons explained above, other embodiments may not include an insulating material.

The metal foil can include an adhesive, for example, to adhere the metal foil to the substrate. In other embodiments, the semiconductor substrate may include an adhesive. In either context the adhesive would be disposed between the metal foil and the back of the semiconductor substrate. A dielectric material, for example, a damage buffer material (DBM), or oxide material can be disposed between the semiconductor substrate and the metal foil.

The metal foil can include different pattern configurations. For example, the metal foil can extend between the first and second solar cells and can include stress relief features. In other examples, the metal foil can include information, such as a 2D bar code for solar cell and/or string level tracking, alignment, etc. The metal foil can include patterns, such as an interdigitated pattern, a fishbone pattern, etc. In an example, the metal foil can include textures, such as corrugation or a pre-texture for uni-directional strength.

The solar cells can include includes doped regions, e.g., N-type and P-type semiconductor regions, for example, a plurality of doped regions, e.g., a first doped region, a second doped region, etc. The solar cells can include a plurality of N-type and P-type semiconductor regions. In some examples, the N-type and P-type semiconductor regions are alternating N-type and P-type semiconductor, e.g., placed one after another or occurring repeatedly, for example as interdigitated fingers. In an embodiment, the plurality of N-type and P-type semiconductor regions is a plurality of N-type and P-type polycrystalline silicon regions disposed above the substrate. In an embodiment, the plurality of N-type and P-type semiconductor regions is a plurality of N-type and P-type diffusion regions disposed in the substrate. The semiconductor regions can be located on the front side, the back side of the semiconductor substrate, or a combination thereof. In an example, the N-type or P-type semiconductor regions can be in or above the substrate or both.

In an embodiment, the metal foil includes laser metallization artifacts, such as described above, for example edge features and/or spatter features.

FIGS. 1A-1F illustrate views of various stages in a string formation and/or metallization method for solar cells, in accordance with an embodiment of the present disclosure.

Figure 1B:
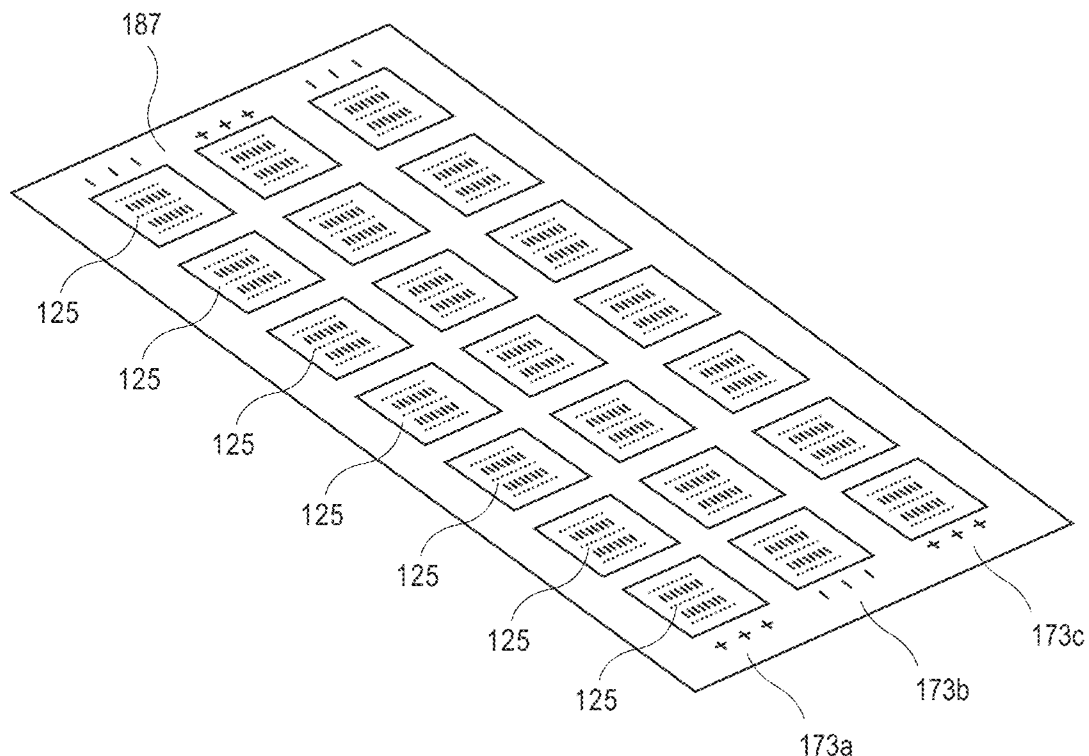

FIG. 1A illustrates an isometric view of semiconductor substrates 125 being arranged to form a solar array or string that are to be stringed and/or arrayed together. In an embodiment, and as used herein, the semiconductor substrates can be solar cells 125. In an embodiment, the solar cells 125 can include doped regions. The solar cells 125 are shown as substantially rectangular; however, it is contemplated the solar cells 125 could be of any shape or size. A solar cell 125 that is substantially rectangular could be, for example, a square, or another rectangular shape, and may have standard, cut, or rounded corners (e.g., pseudo square). As illustrated in FIG. 1A, the solar cells 125 are asymmetric in the sense that the front and back edges of the solar cells 125 have an associated polarity, either + or –, and their arrangement, for example on a front sheet or layup table, is somewhat dictated by the desired configuration of the final circuit desired, for example as shown in FIG. 1B. In an embodiment, the solar cells 125 can be placed over an encapsulant and/or a cover layer which can be part of a solar laminate, solar module and/or a flexible type solar laminate or panel. In an example, the solar cells 125 can be disposed over an encapsulant, and in turn, the encapsulant can be disposed over a cover layer. In an embodiment, the encapsulant can include ethylene vinyl acetate (EVA), polyolefin and/or other encapsulant materials. In an embodiment, the cover layer can include glass. In an embodiment, the solar cells 125 can be placed, instead, over a backsheet, e.g., a backsheet 187 which can also be part of a solar laminate, solar module and/or a flexible type solar laminate or solar panel. In an embodiment, another encapsulant can be placed between the solar cells 125 and the backsheet 187. In an embodiment, the solar cells 125 need not be placed over an encapsulant, cover layer and/or a backsheet at this time. In this way, in an embodiment, the solar cells 125 can be arranged in preparation for a subsequent circuit formation process as described below.

As shown in FIG. 1B the solar cells 125 can be arranged as three strings 173*a*, 173*b*, and 173*c* of alternating polarity, although any arrangement is possible. In other words, in the embodiment shown in FIGS. 1A-1F the asymmetric solar cells can then be placed in the same orientations along each string, as the positive edge of one solar cell is directly adjacent to the negative edge of next solar cell in the string. Alternate arrangements of solar cells are shown in FIGS. 4A-4D. In addition to these specific arrangements, many other arrangements are possible and contemplated, for example as dictated by the specific installation and/or use.

Figure 1C:
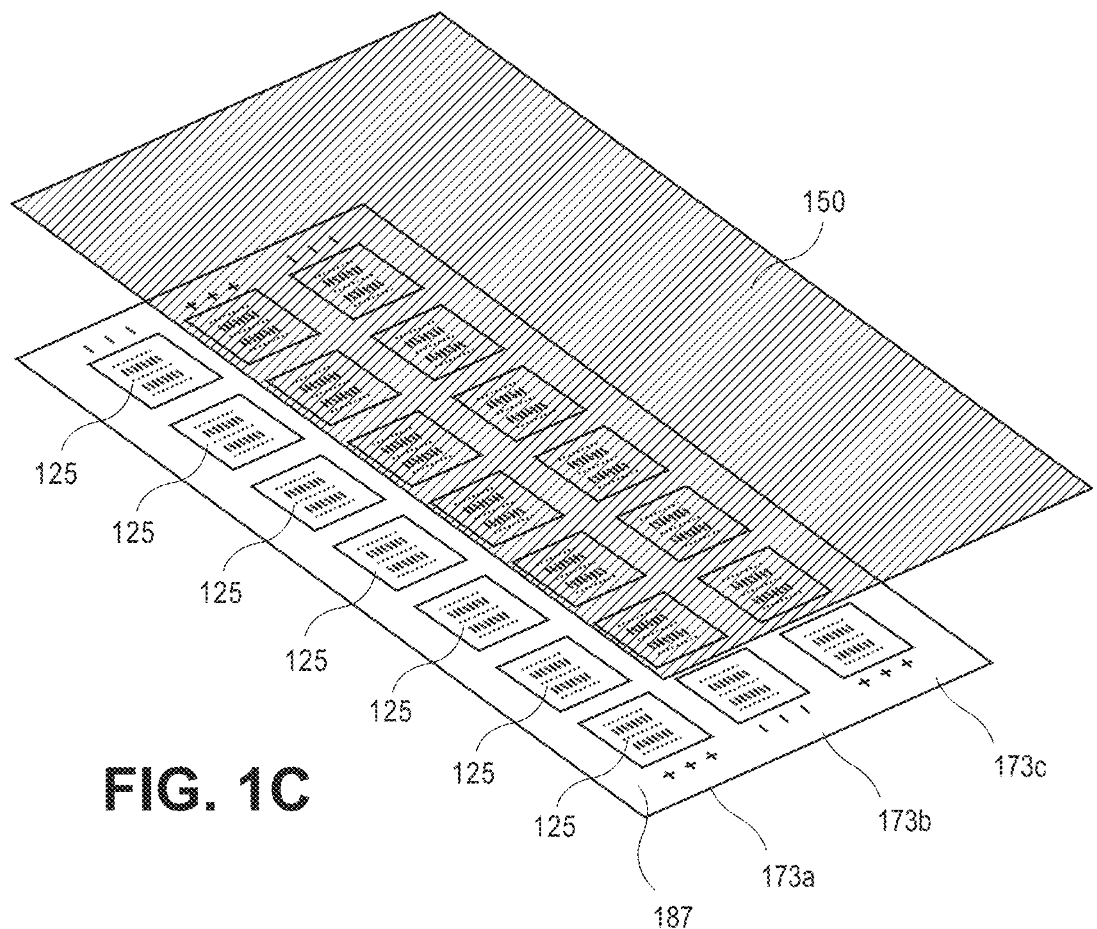

As shown in FIG. 1C, a metal foil sheet 150 can be provided over the arrangement of solar cells, according to some embodiments. In one embodiment, the Al metal foil is an aluminum alloy metal foil including aluminum and second element such as, but not limited to, copper, manganese, silicon, magnesium, zinc, tin, lithium, or combinations thereof. In one embodiment, the Al metal foil is a temper grade metal foil such as, but not limited to, F-grade (as fabricated), O-grade (full soft), H-grade (strain hardened) or T-grade (heat treated). In one embodiment, the aluminum metal foil is an anodized aluminum metal foil. In another embodiment, the aluminum metal foil is not anodized. In an embodiment, the metal foil is a copper, zinc, tin, silver, gold metal foil and the like.

Figure 1D:
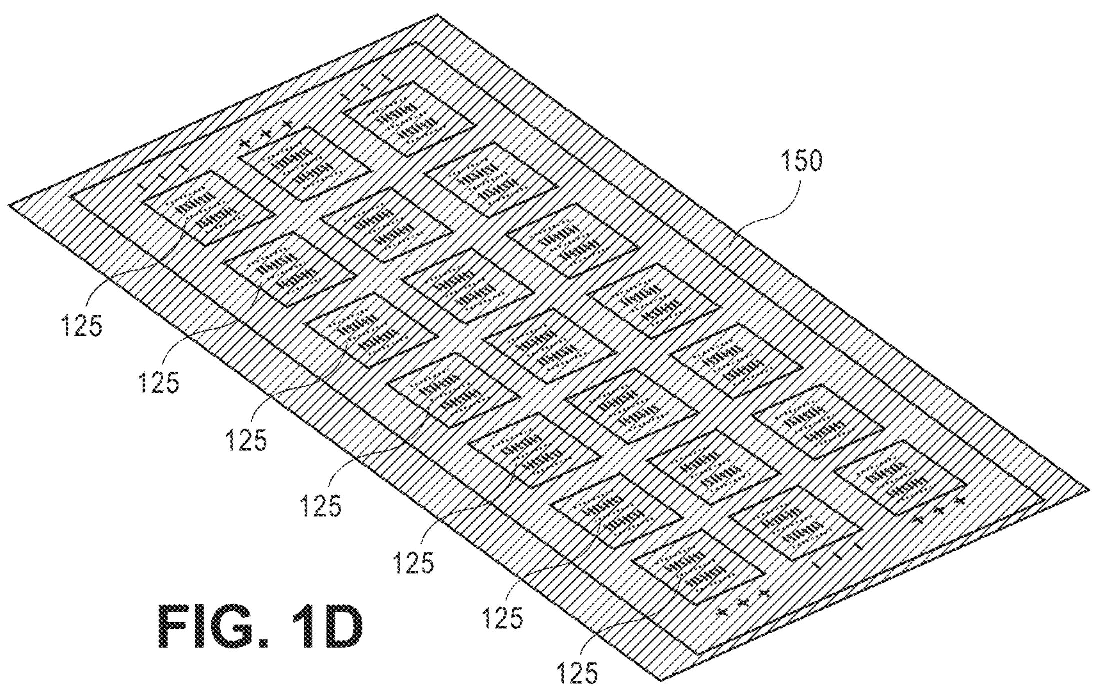

Referring to FIG. 1D, the metal foil sheet 150 can be located on the arrangement of solar cells, according to some embodiments. In an embodiment, locating the metal foil 150 can include unrolling the metal foil 150 over the arrangement of solar cells 125. In some embodiments, locating the metal foil 150 can include aligning the metal foil 150 over and/or on the arrangement of solar cells 125. In an example, an automated process (e.g., using automation, machine vision, robotics) and/or a manual process.

Figure 1E:
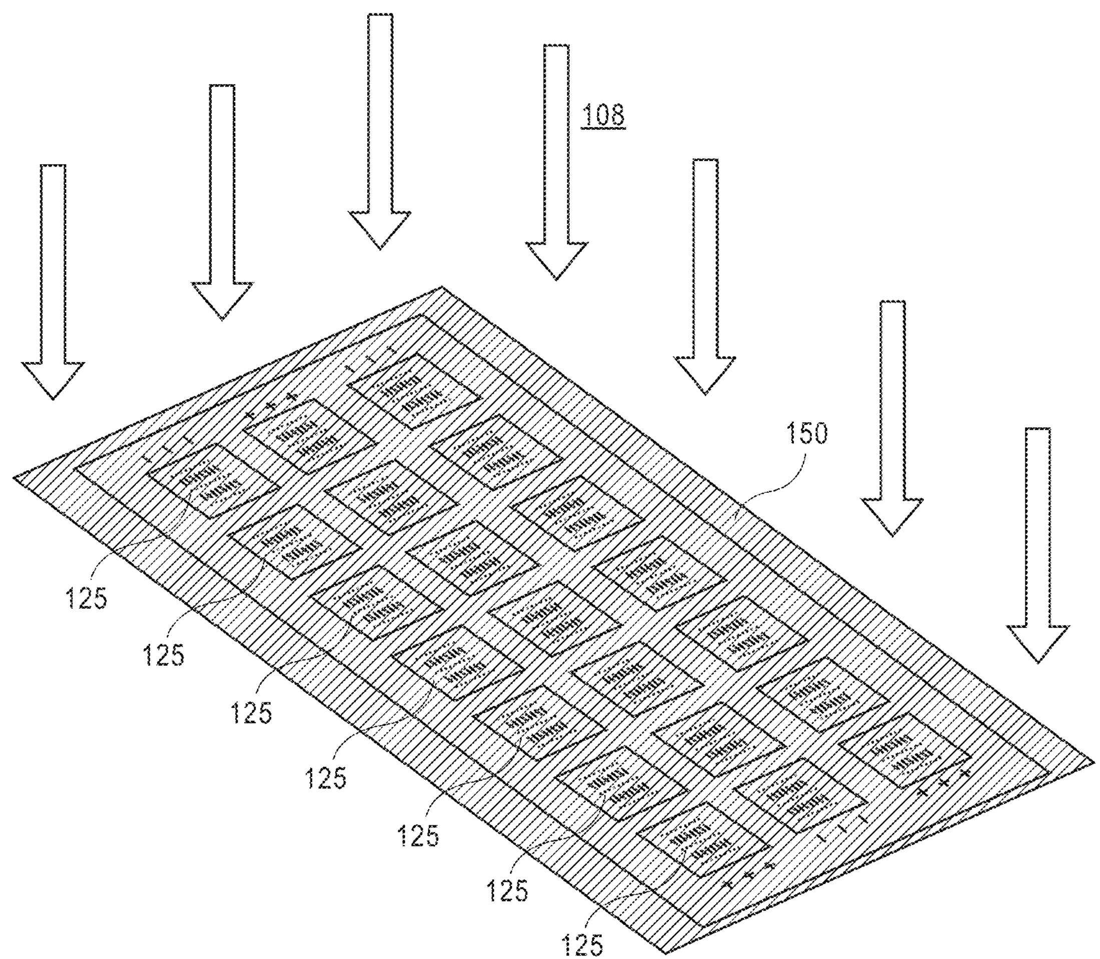

Referring to FIG. 1E, the metal foil 150 can be exposed to a laser beam 108 at locations over the arrangement of solar cells 125, according to some embodiments. Exposing the metal foil 150 to the laser beam 108 can form a plurality of conductive contact structures electrically connected to the arrangement of solar cells 125. In an embodiment, the conductive contact structures can electrically connect doped regions of the solar cells 125 to the metal foil 150, allowing for the flow of electrons from one solar cell through the metal foil 150 and to another solar cell of the arrangement of solar cells 125. In an embodiment, exposing the metal foil 150 to the laser beam can form a string, circuit and/or matrix of electrically connected solar cells. As such the metal foil 150 can conduct electricity to or from the solar cells 125 depending on the polarity of the connection. The conductive contact structures can be uniformly distributed, patterned or otherwise distributed on the solar cells 125.

Referring again to FIG. 1E, in an embodiment, the power of the laser can be selected and used to separate portions of the metal foil 150 that connect the arrangement of solar cells 125. In accordance with one or more embodiments of the present disclosure, each conductive contact structure can include a "locally deposited" metal portion. In one such embodiment, metal foil 150 can act as source or metal and is referred to as a local source since the metal foil 150 is first placed on a substrate surface. The metal foil 150 can then be exposed to a laser process, e.g., exposure to a laser beam, that connects metal from the metal foil 150 (metal source) onto portions of the solar cells 125. In an embodiment the power of the laser can be selected and used to separate the metal foil 150 that connects selected edges of the solar cells 125. Additionally, certain implementations may result in these first portions of the metal foil 150 being fully or at least partially connected to adjacent second portions of the metal foil that have not been subject to laser irradiation. It is further contemplated that in addition to creating an electrical connection between the metal foil 150 and the solar cell 125, that the metal foil can also be used for localized metal deposition and/or patterning, for example as described below with reference to FIGS. 5A-5D, for example to form a conductive contact structure electrically attached the semiconductor substrate, which may include a locally deposited metal portion. Thus, a solar cell 125 that includes the electrically attached metal foil 150 can be used for further fabrication of individual solar cells, for example as described below with reference to FIGS. 5A-5D.

Figure 1F:
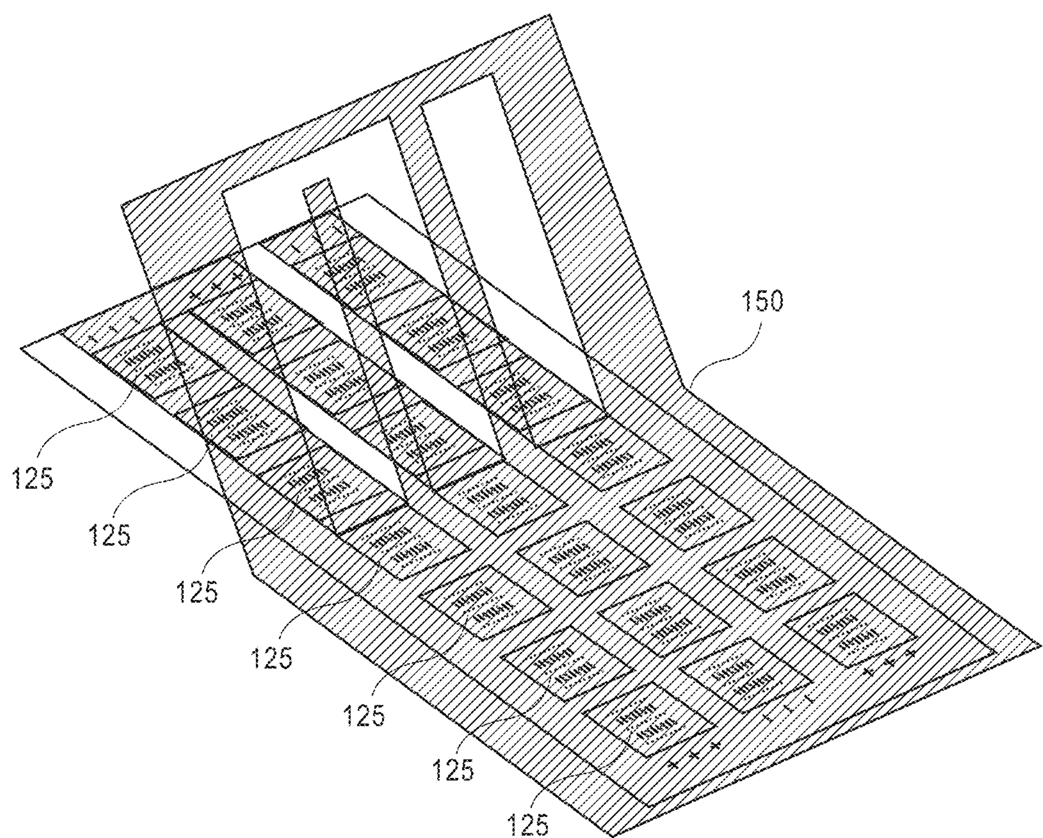

Referring to FIG. 1F, once the metal foil 150 is electrically connected to the solar cells 125, the other portions of the metal foil 150 can be peeled or otherwise removed, so that metal foil 150 left behind makes selected connections between solar cells 125. In an embodiment, the portions of the metal foil that are removed can include portions of the metal foil 150 that are not connected, e.g., electrically and/or mechanically, or at least partially connected to the metal foil 150. In one embodiment, the metal foil 150 can be torn, for example when removed from the solar cells.

Figure 2:
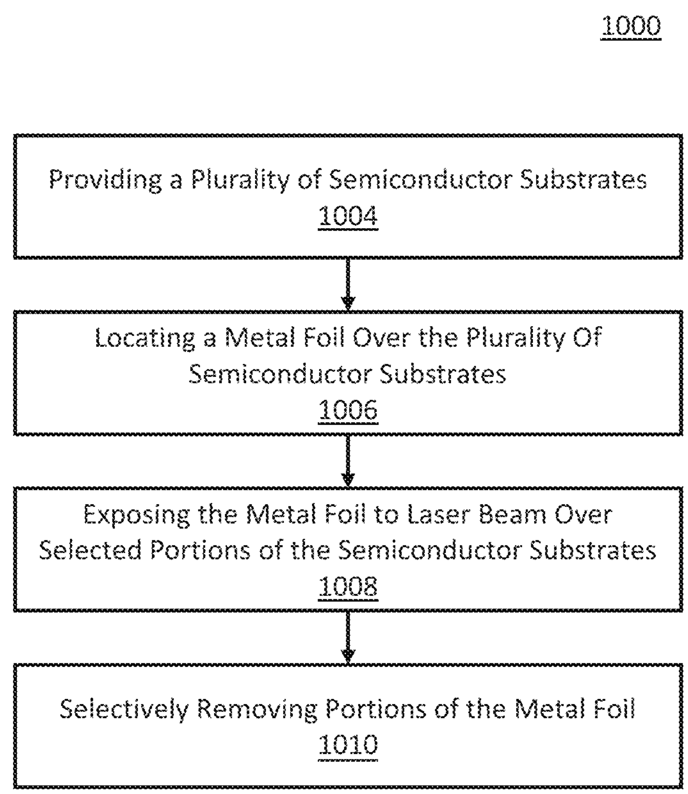
FIG. 2 illustrates an exemplary work flow for constructing a solar cell.

FIG. 2 is a flowchart 100 representing various operations in a method of fabricating a solar cell string, in accordance with an embodiment of the present disclosure. At operation 1004, the method involves providing a plurality of semiconductor substrates. In an embodiment, providing the semiconductor substrates can include providing a plurality of solar cells. In an embodiment, providing the semiconductor substrates and/or solar cells can include locating the semiconductor substrates and/or solar cells on a backsheet (e.g., as described in FIG. 1A). In an embodiment, an encapsulant material can be placed between the solar cells 125 and the backsheet. At operation 1006, the method can involve locating a metal foil over the plurality of semiconductor substrates. At operation 1008, the method can involve exposing the metal foil to laser beam over selected portions of the plurality of semiconductor substrates, wherein exposing the metal foil to the laser beam can form a plurality conductive contact structures having of locally deposited metal portion electrically connecting the metal foil to the semiconductor substrates at the selected portions. At operation 1010, the method can involve selectively removing portions of the metal foil. In some embodiments, selectively removing portions of the metal foil can include removing remaining portions of the metal foil between at least two of the plurality of semiconductor substrates, e.g., portions which extend between at least two of the plurality of semiconductor substrates. In an embodiment, removing portions of the metal foil can include removing portions that were scribed, e.g., laser scribed, or otherwise singluted and/or physically, or at least partially, separated from the metal foil 150.

Portions of the metal foil may be removed from substrate, e.g., by a peel off process. In an embodiment, excess portions can be peeled off from the substrate. In an embodiment, the portions of the metal foil can be portions of metal not exposed to a laser, as described in FIGS. 1A-1F above. In some embodiments, portions of the metal foil can also be exposed to the laser beam or to another laser beam having different properties (e.g., power, frequency, etc.). In other embodiments, the metal foil can be removed by blowing (e.g., compressed air), jetting (e.g., using a high-pressure water jet process), applying an adhesive to the portions of the metal foil and pulling of the adhered portions, or any other metal removal method.

FIGS. 3A-3E illustrate back-side views of the formation of a solar cell array or circuit similarly to FIGS. 1A-1F. In some embodiments, FIGS. 3A-3E can illustrate front side views of the formation of a solar cell array or circuit similarly to FIGS. 1A-1F.

Figure 3A:
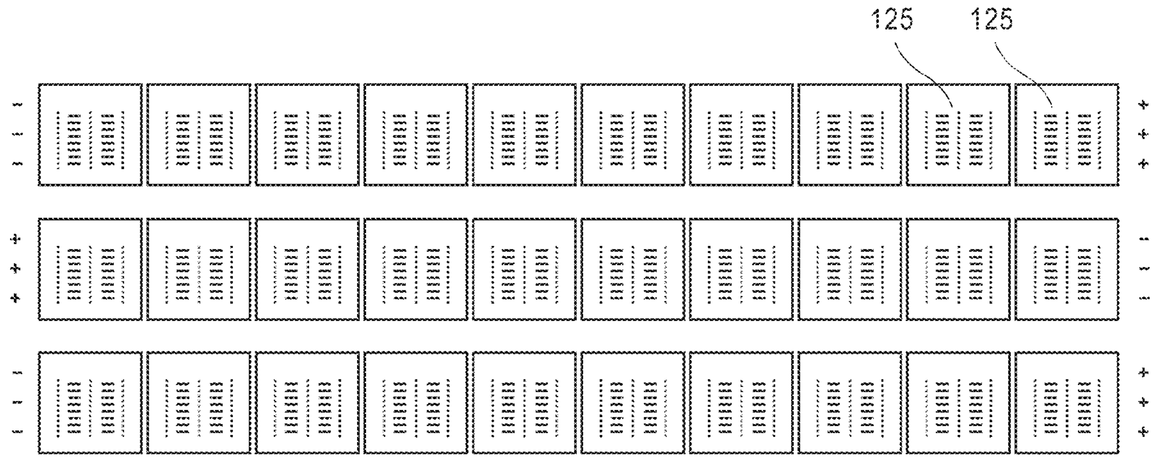
FIGS. 3A-3G illustrate back-side views of the formation of a solar cell array or circuit.

Referring to FIG. 3A the solar cells 125 can be arranged as three strings of alternating polarity. Similarly, to the embodiment shown in FIGS. 1A-1F the asymmetric solar cells 125 can then be placed in the same orientations along each string, as the positive edge of one solar cell 125 is directly adjacent to the negative edge of next solar cell 125 in the string. Although three strings are shown, one, two three, four or more strings can be formed and/or used.

Figure 3B:
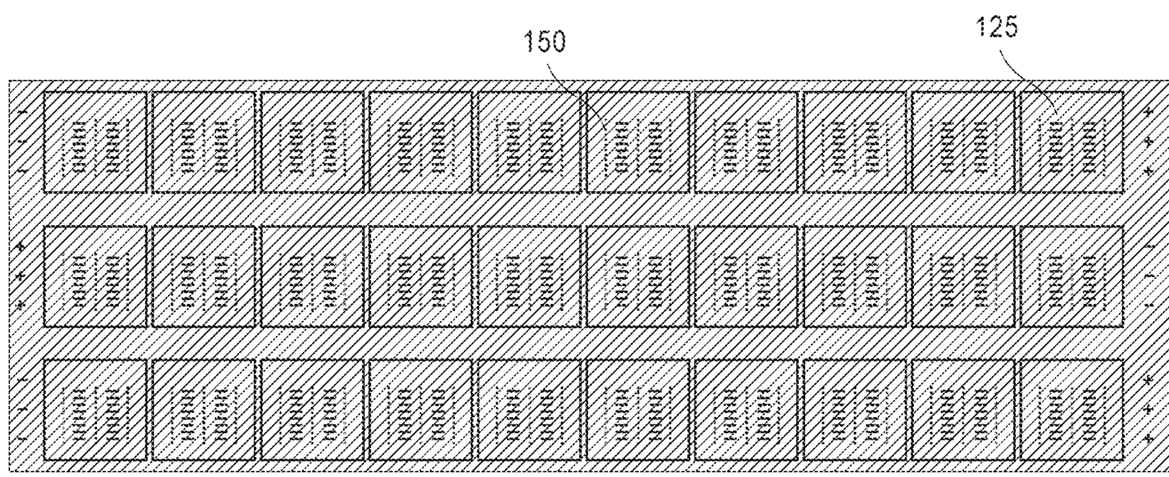

As shown in FIG. 3B a metal foil sheet 150 is provided, and located on the solar cells. In an embodiment, the metal foil 150 can be exposed to a lithographic process to remove portions of the metal foil 150. In one embodiment, the metal foil 150 can be subject to a laser beam on regions corresponding to locations over the solar cells 125. In an embodiment, the metal foil 150 can be subjected to a laser beam along selected edges of the solar cells 125. In an embodiment, exposing the metal foil 150 to the laser beam can form a plurality of conductive contact structures electrically connected to the backside of the solar cells 125. In some embodiments, exposing the metal foil 150 to the laser beam can form a plurality of conductive contact structures electrically connected to the front side of the solar cells 125. In an embodiment, the conductive contact structures can include the conductive contact structures including locally deposited metal portions, as described above and herein.

Figure 3C:
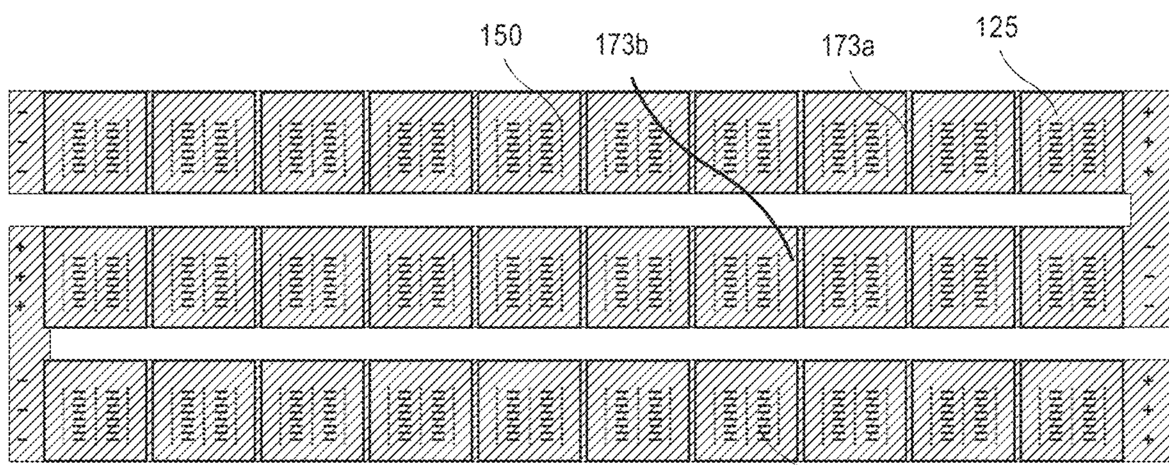

Referring to FIG. 3C, portions of the metal foil 150 can be manipulated, such as peeled or otherwise removed, so that metal foil 150 left behind can make selected connections between solar cells 125. In an example, once the metal foil 150 is electrically connected to the solar cells 125, the portions of the metal foil 150 that are not connected to the solar cells of the can be manipulated, such as peeled or otherwise removed, so that metal foil 150 left behind can make selected connections between solar cells 125. In this example the foil between the strings can been removed except at the ends, where connections are maintained to create a set of three solar cell strings 173*a*, 173*b*, 173*c* connected in series. In an embodiment, the metal foil can be electrically connected to the back side of the solar cells 125, the portions of the metal foil 150 that are not connected to the selected edges of the can be manipulated such as peeled or otherwise removed, so that metal foil 150 left behind makes selected connections between solar cells 125. In some embodiments, the metal foil can instead be connected to the front sides of the solar cells. In an embodiment, the metal foil can be electrically connected to selected edges of the back side of the solar cells 125, the portions of the metal foil 150 that are not connected to the selected edges of the can be manipulated such as peeled or otherwise removed, so that metal foil 150 left behind makes selected connections between solar cells 125. In embodiments, the metal foil can be electrically connected to selected edges of the backside and/or front sides of the solar cells 125. In one example, the metal foil 150 can have include conductive contact structures, for example as described below with reference to FIGS. 5A-5D.

Figure 3D:
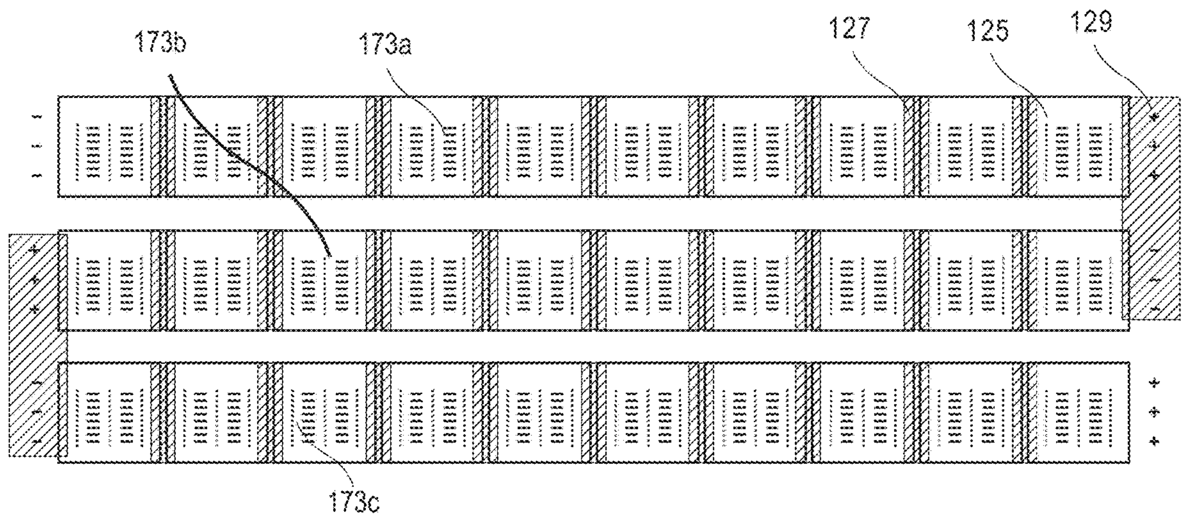

Referring to FIG. 3D in an example, a substantial portion of the metal foil disposed over individual solar cells 125 can be removed. In an example, portions of metal foil 127 located between adjacent solar cells 125 can be maintained to create a set of three solar cell strings 173*a*, 173*b*, 173*c* connected in series. Although, in an embodiment, three solar cell strings 173*a*, 173*b*, 173*c* are shown. A plurality of solar cell strings, e.g., one, two, three, four or more solar cells strings can be connected in this manner. In an embodiment, the portions of metal foil 127 can be interconnecting portions 127 or referred to as interconnects 127. In an embodiment, the interconnecting portions 127 can be disposed partially over edges of the solar cells 125 and as well as disposed between solar cells 125. Busbar portions 129, can connect two or more solar cell strings together as shown. In an example, the busbar portion 129 can connect the solar cell strings 173*a*, 173*b*, 173*c* in series or parallel arrangements. In an embodiment, the methods described herein can include forming the interconnecting portions 127, busbar portions 129 and/or other portions from the metal foil. In one example, with the interconnecting portions 127 and Busbar portions 129 can include conductive contact structures, for example as described below with reference to FIGS. 5A-5D. The busbar portions 129 can be rolled, folded and/or trimmed in a subsequent process, after a LAMP technique is applied. By rolling, folding or trimming the busbar portions 129, a space between a solar cell 125 and an edge of module constructed therefrom can be minimized.

Figure 3E:
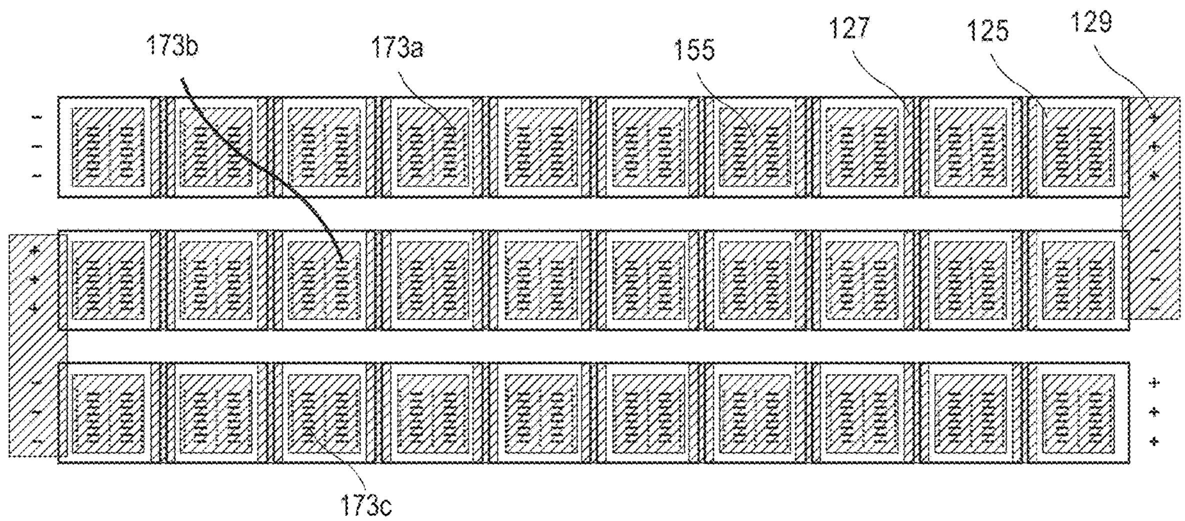

Referring to FIG. 3E in an example, the metal foil can be used to form conductive contact structures 155 as well as provide interconnecting portions 127 between adjacent solar cells solar cell 125 and busbar portions 129 between solar cell strings 173*a*, 173*b*, 173*c*. In one example, with the conductive contact structures 155 can include conductive contact structures, for example as described below with reference to FIGS. 5A-5D. Thus, in an example, a single foil sheet can be used to provide both connections between solar cells 127 and localized metallization 155 to the individual solar cells as well as busbar portions 129 between solar cell strings.

Figure 3F:
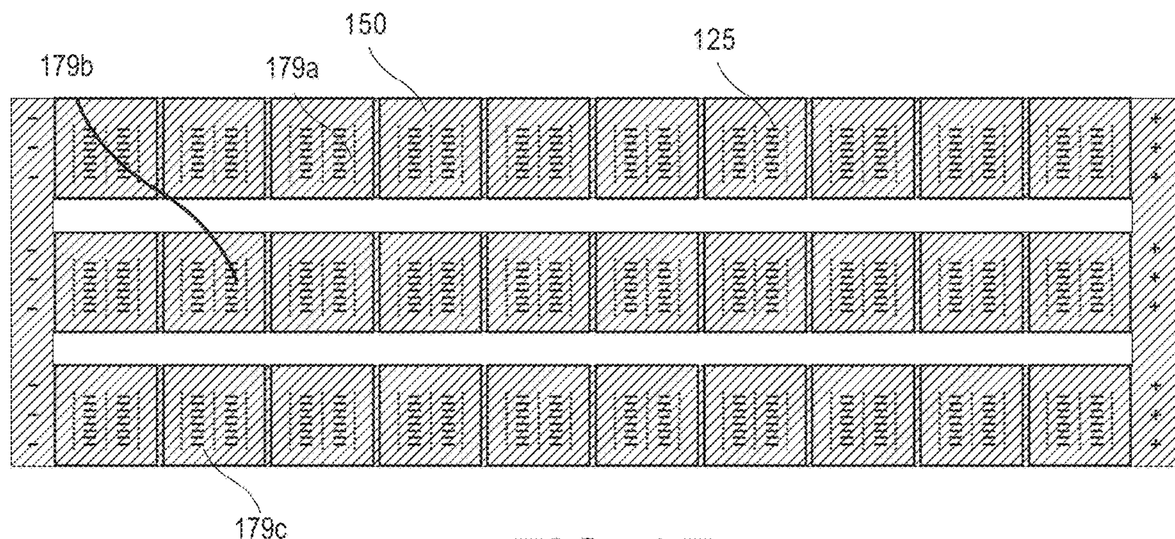

FIG. 3F illustrates a parallel circuit arrangement of a solar cell array or circuit, according to some embodiments. As described in FIG. 3B, once the metal foil 150 is electrically connected to the solar cells 125, portions of the metal foil 150 that are not connected can be manipulated, such as peeled or otherwise removed. In an embodiment, the portions left behind 150 of the metal foil can make selected connections between solar cells 125 to form solar cell strings 179*a*, 179*b* and 179*c* connected in parallel. In an embodiment, the metal foil 150 can be used to form conductive contact structures, for example as described below with reference to FIGS. 5A-5D.

Figure 3G:
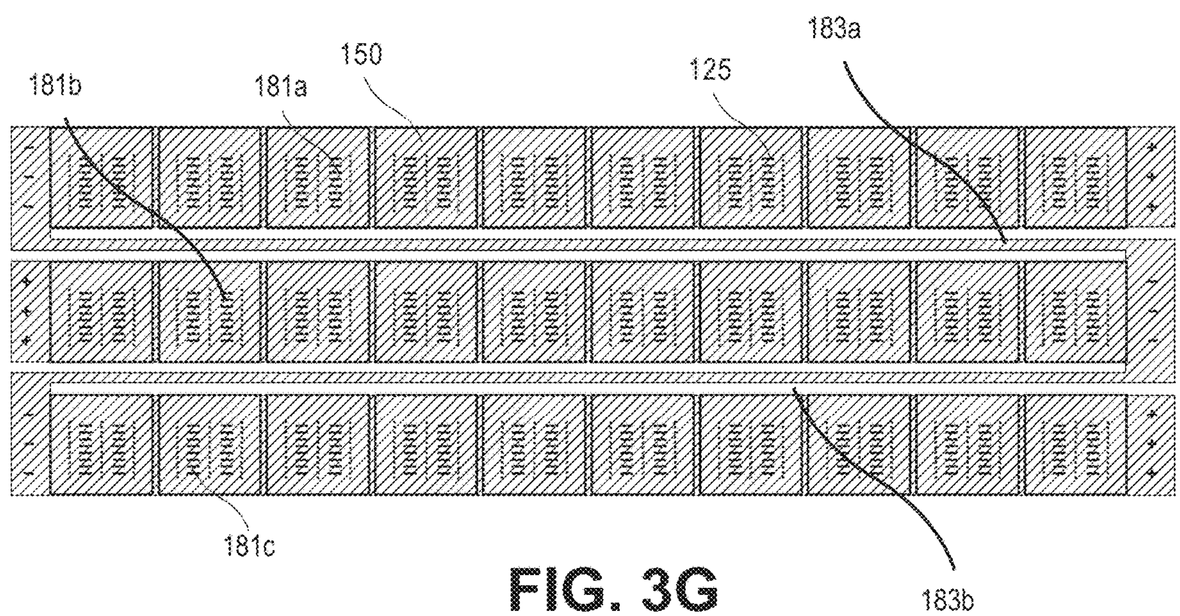

FIG. 3G illustrates a solar cell array or circuit, according to some embodiments. The embodiment shown illustrates another circuit arrangement but with the strings 181*a*, 181*b* and 181*c* arranged parallel but with alternating polarity, demonstrating that be selectively connection of the solar cells 125 with the metal foil 150 that a multitude of circuit designs is possible. In an embodiment, bypass lines 183*a* and 183*b* of metal foil that can run parallel to the solar cell strings can be connect the opposite ends of the solar cell strings, as shown. Although two bypass lines are shown, one, two or more bypass lines can be used. In an example, one bypass line can be used between a first and second solar cell string, where a third solar cell string can be connected to a second or first solar cell string by a busbar (e.g., referring to the busbar example in FIGS. 3C, 3D and 3E. In an embodiment, the metal foil 150 can be used to form conductive contact structures, for example as described below with reference to FIGS. 5A-5D.

FIGS. 4A-4D illustrate back-side views of the formation of a solar cell array or circuit. In some embodiments, FIGS. 4A-4D can refer to front side views of the formation of a solar cell array or circuit.

Figure 4A:
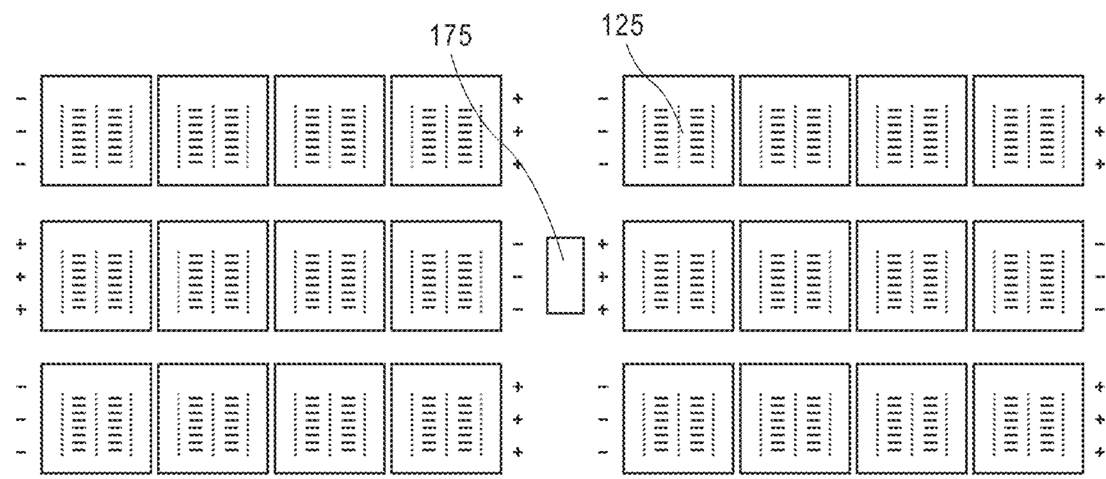
FIGS. 4A-4D illustrate back-side views of the formation of a solar cell array or circuit.

Referring to FIG. 4A, illustrates two parallel solar cell strings 177*a* and 177*b* connected to a junction box 175, according to some embodiments. As shown in FIG. 4A, a plurality of solar cells 125 can be arranged with a junction box 175. In an embodiment, it can be inferred that there can be a multitude of permutations, combinations and circuit designs when using a metal foil to connect solar cell strings together. In an embodiment, a plurality of solar cells 125 can be placed on a backsheet, e.g., in preparation for the formation of a solar string, solar laminate, solar module and/or a flexible type solar panel. In an embodiment, an encapsulant material can be placed between the solar cells 125 and the backsheet.

Figure 4B:
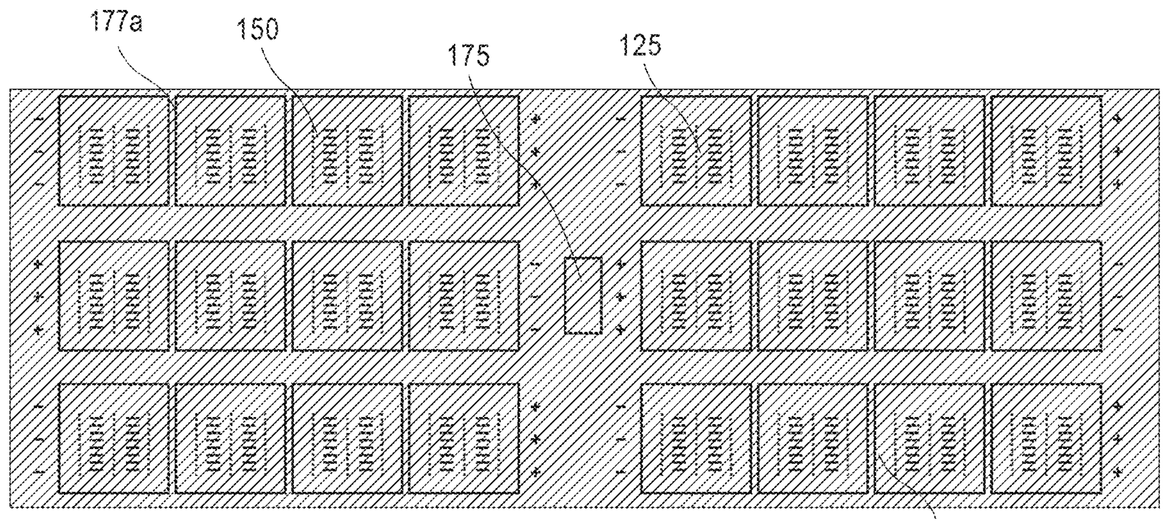

As shown in FIG. 4B a metal foil sheet 150 is provided, and can be located on the arrangement or a plurality of solar cells 125. Once located, the metal foil sheet 150 can be exposed to a laser beam. In an embodiment, exposing the metal foil sheet 150 to a laser beam can include exposing the metal foil sheet 150 along selected edges of the plurality of solar cells 125 including forming an outline for a connection to the junction box. In an embodiment, exposing the metal foil sheet 150 to a laser beam can form a plurality of conductive contact structures electrically connected to the solar cells 125 and the junction box 175. In an embodiment, exposing the metal foil sheet 150 to a laser beam can include forming conductive contact structures, for example as described below with reference to FIGS. 5A-5D.

Figure 4C:
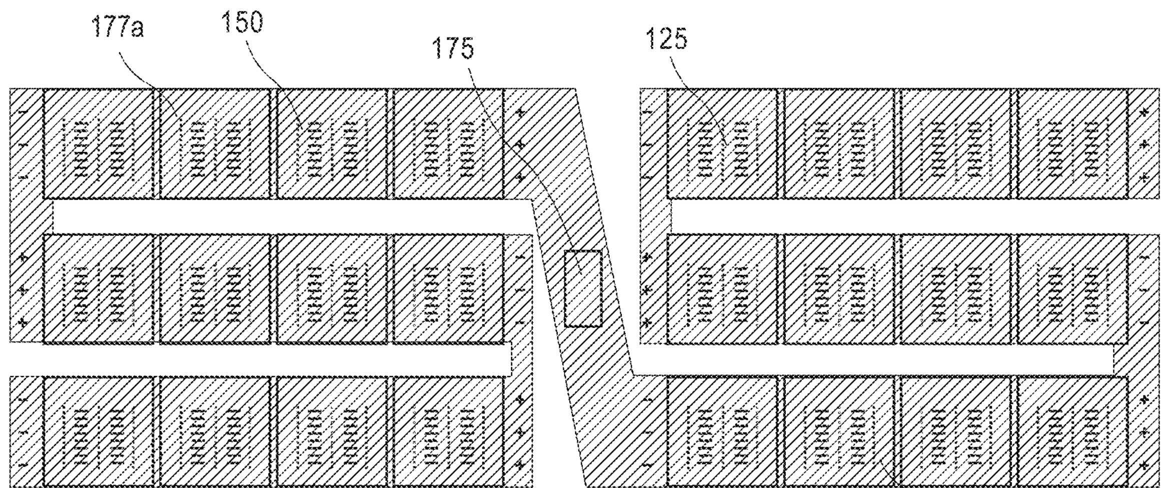

Referring to FIG. 4C, the metal foil 150 can be electrically connected to the backside of the solar cells 125, the portions of the metal foil 150 that are not connected to the solar cells can be manipulated, such as peeled or otherwise removed, so that metal foil 150 left behind makes selected connections to and between solar cells 125, solar cell strings and to the junction box 175. In an embodiment, the front sides of the solar cells 125 can, instead, be connected to the metal foil 150. In an embodiment, the metal foil 150 can be electrically connected to selected edges of the backside of the solar cells 125, the portions of the metal foil 150 that are not connected to the selected edges of the can be manipulated, such as peeled or otherwise removed, so that metal foil 150 left behind makes selected connections to and between solar cells 125, solar cell strings and to the junction box 175. In an example, interconnects 127 and 129 as shown in FIG. 3D, or solar cell level metallization 155 as shown in FIG. 3E. In an embodiment, connecting the metal foil 150 to the solar cells 125 in this way can include forming conductive contact structures, for example as described below with reference to FIGS. 5A-5D.

Figure 4D:
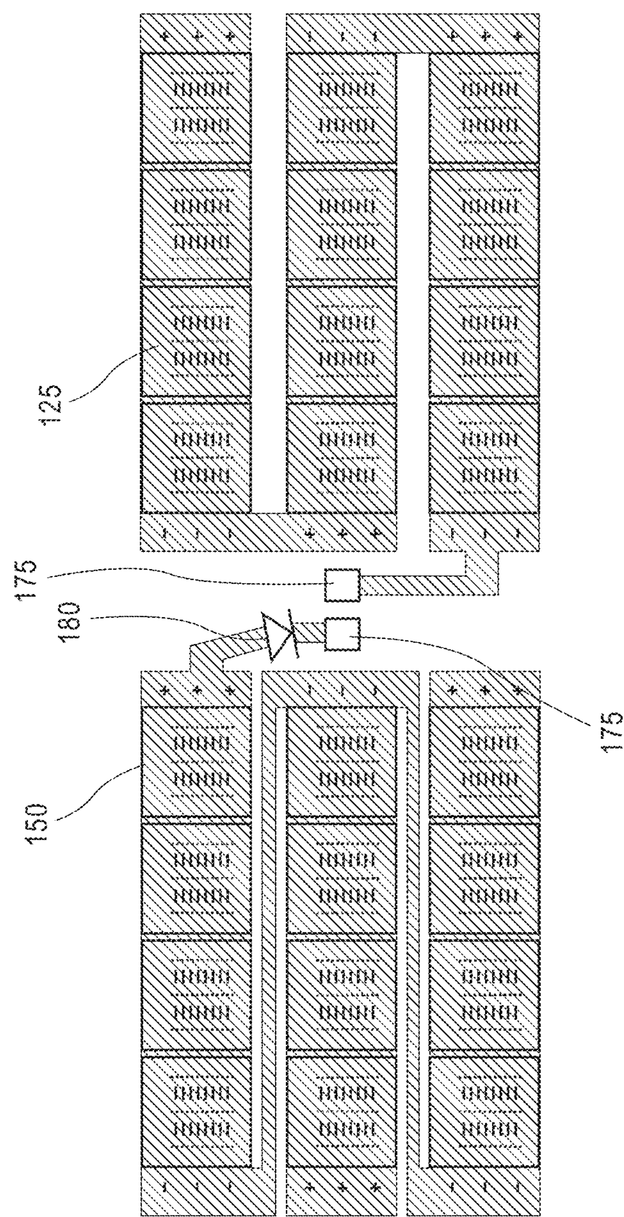

FIG. 4D illustrates a back-side view of a solar cell array or circuit. The embodiment shown illustrates two parallel circuit arrangements connected to junction boxes 175 and a bypass diode 180, demonstrating that be selectively connection of the solar cells 125 with the metal foil 150 that a multitude of circuit designs is possible. In an embodiment, the portions of the metal foil 150 can be manipulated, such as peeled or otherwise removed, so that metal foil 150 left behind makes selected connections between solar cells 125 and the junction box 175, for example interconnects 127 and 129 as shown in FIG. 3D, or solar cell level metallization 155 as shown in FIG. 3E. In an embodiment, once the metal foil 150 is electrically connected to selected edges of the backside of the solar cells 125, the portions of the metal foil 150 that are not connected to the selected edges of the can be manipulated, such as peeled or otherwise removed, so that metal foil 150 left behind makes selected connections between solar cells 125 and the junction box 175, for example interconnects 127 and 129 as shown in FIG. 3D, or solar cell level metallization 155 as shown in FIG. 3E. In an embodiment, connecting the metal foil 150 to the solar cells 125 in this way can include forming conductive contact structures, for example as described below with reference to FIGS. 5A-5D.

In addition to providing for selected connections between the individual solar cells and solar cell strings, the methods described herein can be used to form solar cell level metallization structures. Such structures, and corresponding methods of forming the solar cell metallization structures, are described.

FIGS. 5A-5D illustrate cross-sectional views of an exemplary solar cell at various operational steps in a method of fabricating the solar cell.

Figure 5A:
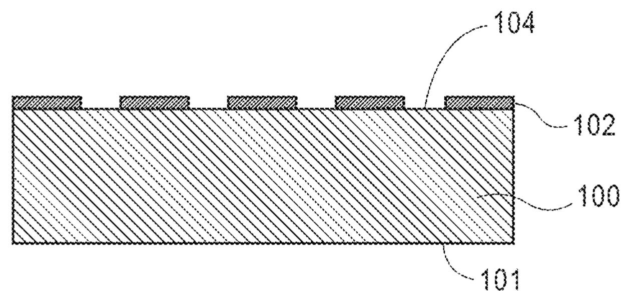
FIGS. 5A-5D illustrate cross-sectional views of operations in a method of fabricating a solar cell.

Referring to FIG. 5A, an intervening layer 102 is formed on or above a solar cell substrate 100. Intervening layer 102 has openings 104 therein. While particular reference is made to forming the intervening layer on or above the substrate it is appreciated that the direction above is relative and that this intervening layer can be formed on the back, the front, or even the back and the front, of a selected substrate, for example, for metallization of the front, back, or both the front and back of the substrate.

Intervening layer 102 is formed either with openings 104 (e.g., patterned as deposited) or openings 104 are formed in a blanket-deposited intervening layer. In the latter case, in one embodiment, openings 104 are formed in intervening layer 102 by patterning with laser ablation and/or a lithography and etch process.

Intervening layer 102 can be formed on a backside of substrate 100 opposite a light-receiving side 101 of the substrate 100. Passivation and/or intervening layers (e.g., ARC) can also be formed on the back side of the substrate 100. Specifically, the intervening layer 102 can be a back anti-reflective layer (BARC).

The light receiving surface 101 can have a texturized light-receiving surface. An hydroxide-based wet etchant can be employed to texturize the light receiving surface 101 of the substrate 100. A texturized surface is one which has a regular or an irregular shaped surface for scattering incoming light, decreasing the amount of light reflected off of the light receiving surface 101 of the solar cell. Passivation and/or insulating (e.g., ARC) layers can be formed on the light-receiving surface 101.

While this disclosure is primarily directed to back-contact solar cells, the methods and techniques discussed herein, and specifically the LAMP techniques, can be applied to the metallization of a substrate in other solar cell types, such as front contact solar cells (e.g., PERC solar cells, mono-PERC solar cells, HIT solar cells, TopCon solar cells, (PERL) cells, and tandem cells, and other types of solar cells).

The openings 104 in intervening layer 102 can expose portions of a plurality of semiconductor regions formed in or above the substrate 100, including portions of a plurality of first semiconductor regions and second semiconductor regions formed in or above the substrate 100 (e.g., N-type and P-type semiconductor regions or vice versa). The substrate 100 can a monocrystalline silicon substrate, such as a bulk single crystalline N-type doped silicon substrate, or a layer, such as a multi-crystalline silicon layer, disposed on a monocrystalline solar cell substrate. The substrate 100 can have disposed therein/thereon N-type doped regions and P-type doped regions, portions of which are exposed by openings 104 in intervening layer 102. In a front contact solar cell implementation, the semiconductor regions on one side of the solar cell can be of the same conductivity type (e.g., P-type or N-type).

The N-type and/or P-type semiconductor regions can be disposed on a dielectric layer, such as a tunneling oxide layer including silicon oxide having a thickness of approximately 2 nanometers or less. The N-type and/or P-type semiconductor regions can be formed from polycrystalline silicon formed by, e.g., using a plasma-enhanced chemical vapor deposition (PECVD) process. The N-type polycrystalline silicon emitter regions can be doped with an N-type impurity, such as phosphorus, and the P-type polycrystalline silicon emitter regions can be doped with a P-type impurity, such as boron. In an embodiment, the N-type and P-type semiconductor regions are separated from one another. In an example, the N-type and P-type semiconductor regions have trenches or intrinsic (or lightly doped) regions formed there between. Trenches can extend partially into the substrate, and by covered by intervening layer 102. Lightly doped regions can have a doping concentration substantially less than the N-type and P-type semiconductor regions. The dielectric layer, e.g., a tunnel oxide or silicon dioxide layer, can be located between the N-type and P-type semiconductor regions, and can be located laterally between the N-type and P-type semiconductor regions.

Figure 5B:
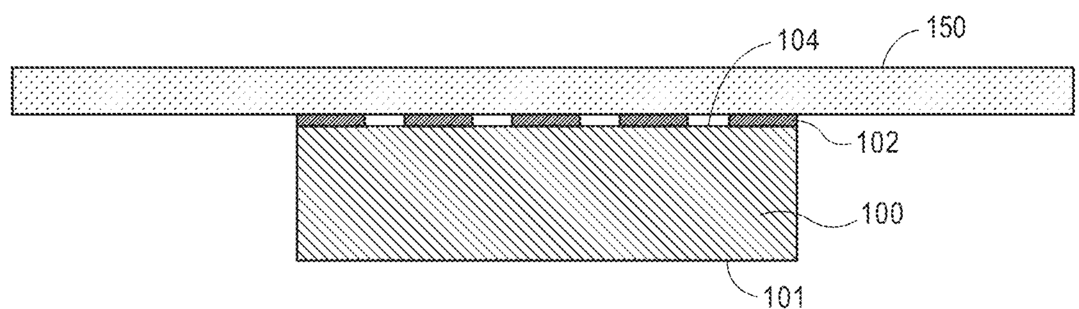

Referring to FIG. 5B, a metal foil 106 is located over the intervening layer 102. In an embodiment, locating the metal foil 106 over the intervening layer can include positioning the metal foil over the substrate 100. In an example, positioning the metal foil 106 over the substrate 100 can include covering the entire substrate 100. In an embodiment, portions of the metal foil 106 can be located over the substrate 100 and other portions can be located away, e.g., extend away from the substrate 100 in a lateral direction as shown in FIG. 5B. In an embodiment, in order to secure the metal foil 106 with the substrate 100, a locating process can be performed, including using a vacuum and/or a tacking process to hold the metal foil 106 in place over the substrate 100. In an example, the locating process includes performing a thermocompression process. In further example, a roller can be used to position or locate the metal foil 106 over the substrate 100. In an embodiment, the vacuum process, thermocompression process or other similar process can uniformly position the metal foil to inhibit air gaps or pockets of air between the metal foil and the substrate, as shown. In an example, a roller can be used to uniformly position the metal foil 106 over the substrate 100.

At the time of locating the metal foil 106 over the substrate 100, the metal foil 106 can have a surface area substantially larger than a surface area of the solar cell. In another embodiment, however, prior to placing the metal foil 100 over the solar cell, a large sheet of foil can be cut to provide the metal foil 106 having a surface area substantially the same as a surface area of the substrate 100. The metal foil can be laser cut, water jet cut, and the like, for example, prior to or even after placement on or above the substrate 100.

In an embodiment, the metal foil 106 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil can be an anodized aluminum foil. In another embodiment, the aluminum foil is not anodized.

Figure 5C:
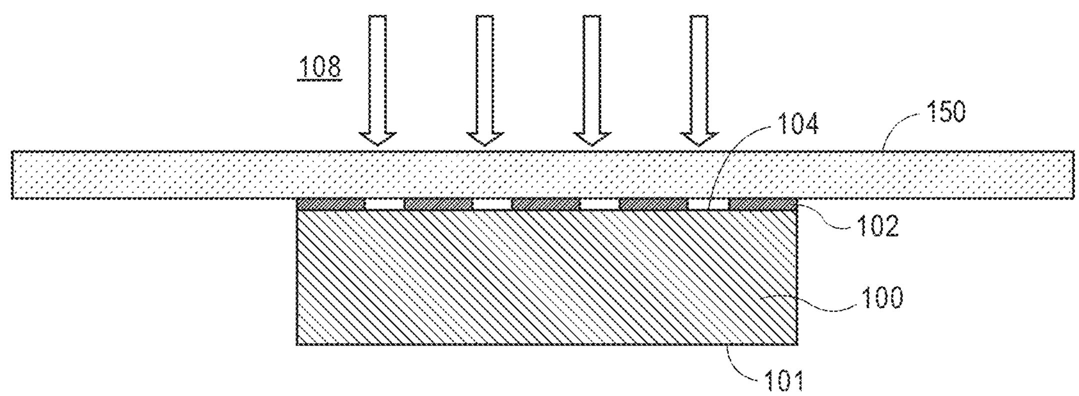

Referring to FIG. 5C, the metal foil 106 can be exposed to a laser beam 108 in locations over the openings 104 in the intervening layer 102 exposing portions of the semiconductor regions in or above the substrate 100. In an embodiment, regions of the metal foil 106 are selectively exposed to a laser beam 108 in locations at least partially over the openings 104 in the intervening layer 102. In some embodiments, the metal foil 106 is exposed to a laser beam 108 in locations offset, e.g., partially over or not over, the openings 104 in the intervening layer 102. In an example, the metal foil 106 is exposed to a laser beam 108 in locations adjacent to the openings 104.

Figure 5D:
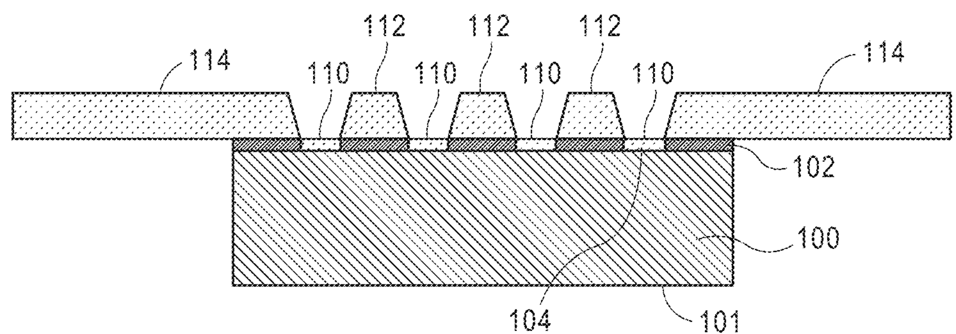

Referring to FIG. 5D, exposing the metal foil 106 to the laser beam 108 forms a plurality of conductive contact structures 110 electrically connected to the semiconductor regions in or above the substrate 100.

In accordance with one or more embodiments of the present disclosure, each conductive contact structure 110 is or includes a locally deposited metal portion. In one such embodiment, metal foil 106 acts as source or metal and is referred to as a local source since the metal foil 106 is first placed on a substrate surface. The metal foil 106 is then exposed to a laser process, e.g., exposure to a laser beam, that deposits metal from the metal foil 106 (metal source) onto portions of the substrate. It is to be appreciated that the resulting locally deposited metal portions can have an edge feature which can be distinguished from metal structure formed by other deposition processes such as plating, welding, or thermal bonding which can provide conformal structures absent an edge feature.

Referring again to FIG. 5D, second portions or portions 112 and 114 of the metal foil 106 not exposed to the laser beam 108 are retained on the intervening layer 102. The portions 112 are central portions, while the portions 114 are edge portions and can be overhang portions, as is depicted. In certain implementations, such second portions are not deposited or secured to the solar cell or the intervening layer 102. In an embodiment, the structure of FIG. 5D is implemented as a solar cell without removal of portions 112 and/or 114 of the metal foil 106. Such a structure can be used for a back surface metallization of a front contact solar cell.

Figure 6A:
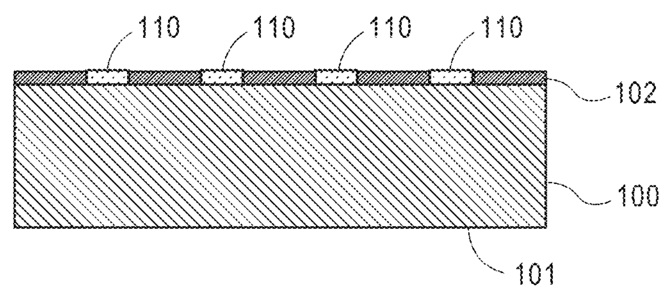
FIGS. 6A-6C illustrates a cross-sectional views of a solar cell.
Figure 6B:
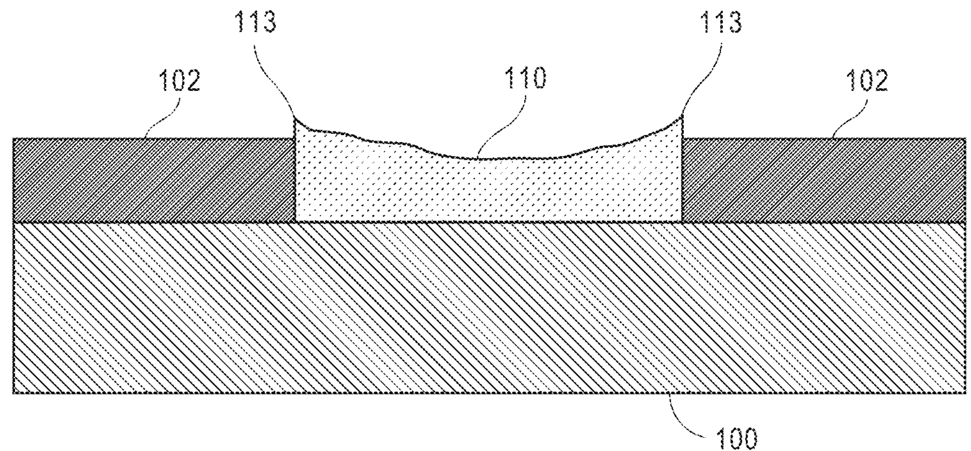
Figure 6C:
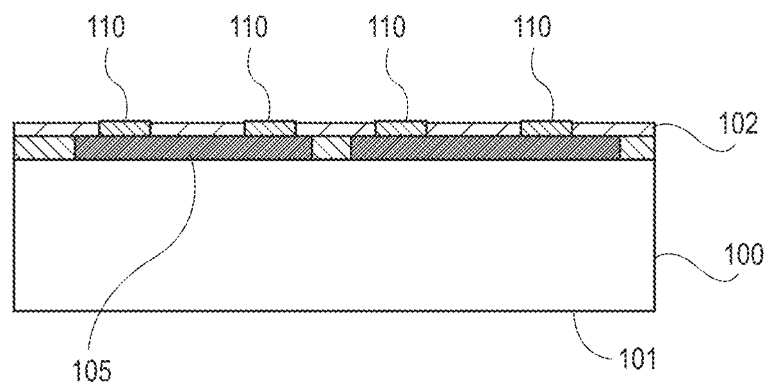

FIGS. 6A-6C illustrate cross-sectional views of a solar cell. As shown in FIG. 6A, removal of the second portions of the metal foil can leave behind the conductive contact structures 110 on the locations in the intervening layer 102 that have exposed portions of the plurality of N-type and/or P-type semiconductor regions in or above the substrate 100. In FIG. 6B, the formation of sharp or torn edge features 113 on either side of the conductive contact structures 110 is shown. These edge features 113, as described above, are formed from the removal the second portions of the metal foil not exposed to the laser beam. In some embodiments, some portions 112 and 114 are removed and other portions 112 and 114 remain. In an embodiment, exposing the metal foil 106 to the laser beam 108 includes removing all or substantially all portions of the metal foil not exposed to the laser beam.

FIG. 6C shows the position of N-type and/or P-type semiconductor regions 105. In the embodiment shown, N-type and/or P-type semiconductor regions 105 are separated from one another, and each semiconductor region has two conductive contact structures 110. Alternatives, not shown, include one, three or more conductive contact structures per semiconductor region. In an example, the N-type and/or P-type semiconductor regions can have trenches formed there between, the trenches extending partially into the substrate, and covered by intervening layer 102. In one example, N-type and/or P-type semiconductor regions can be separated by an intrinsic or lightly doped region there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above.

With reference back to FIGS. 5A-5F, subsequent to applying a laser beam 108 to the metal foil 106, in an example, only portions 114 of the metal foil 106 not exposed to the laser beam 108 are removed, while some portions 112 of the metal foil 106 are retained. In an embodiment, portions 112 can be selectively exposed to the laser beam 108 or a different/subsequent laser beam, which can use the same laser at different laser settings/variables.

Figure 7:
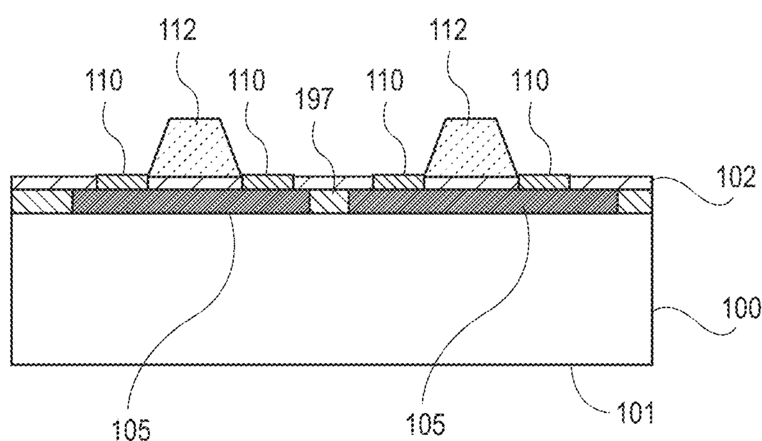
FIG. 7 illustrates a cross-sectional view of a solar cell.

FIG. 7 illustrates a cross-sectional view of a solar cell. As shown in FIG. 7, the laser forms the conductive contact structures 110 and portions 112 above the intervening layer 102, such as an ARC or BARC layer. Portions 114 have been removed. The position of N-type and/or P-type semiconductor regions 105. In one example, N-type and/or P-type semiconductor regions are separated, for example by a lightly doped region 197 there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above. It is further contemplated that the portions 112 can formed from a second metal source as described, as described above.

FIGS. 8A-8E illustrates example semiconductor substrates fabricated using methods, approaches or equipment described herein, according to some embodiments. The semiconductor substrates are solar cells 1520*a-e* and can include a silicon substrate 1525. The silicon substrate 1525 can be cleaned, polished, planarized and/or thinned or otherwise processed. The semiconductor substrate 1525 can be a single-crystalline or a multi-crystalline silicon substrate, N-type or P-type. The solar cells can have a front side 1502 and a back side 1504, where the front side 1502 is opposite the back side 1504. The front side 1502 can be referred to as a light receiving surface 1502 and the back side 1504 can be referred to as a back surface 1504. The solar cells can include a first doped region 1521 and a second doped region 1522. In an embodiment, the first doped region can be a P-type doped region (e.g., doped with boron) and the second doped region can be an N-type doped region (e.g., doped with phosphorus). The solar cells 1520*a-e* can include an intervening layer (e.g., anti-reflective coating ARC) 1526 on the front side 1502 of the solar cells. The solar cells 1520*a-e* can include a back intervening layer (e.g., back anti-reflective coating BARC) 1526 on the back side 1504 of the solar cells.

Figure 8A:
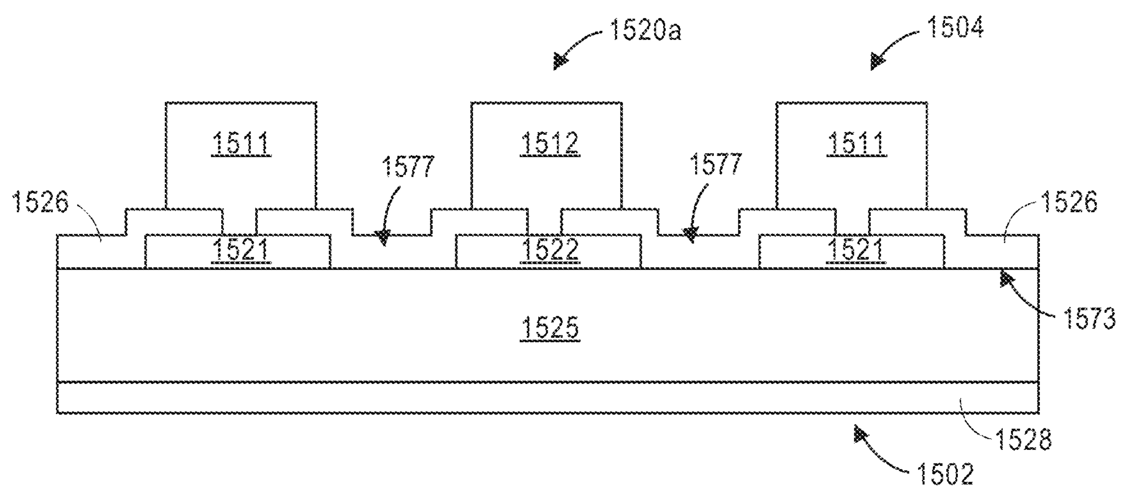
FIGS. 8A-8E illustrates example semiconductor substrates fabricated using methods.

FIG. 8A illustrates an exemplary back-contact solar cell fabricated using methods, approaches or equipment described herein. The back-contact solar cell 1520*a* can include the first and second doped regions 1521, 1522 disposed on a back side 1504 of a solar cell 1520*a*. In an example, the first and second doped regions 1521, 1522 can be doped semiconductor regions. The first and second doped regions 1521, 1522 can be doped polysilicon regions. A thin oxide layer 1573 (e.g., tunnel oxide layer) can be disposed between the first and second doped regions 1521, 1522 and the substrate 1525. The first and second doped regions 1521, 1522 can, instead, be located in the substrate 1525. Conductive contact structures 1511, 1512 are located on the back side 1504 of the solar cell 1520*a*, where the conductive contact structures 1511, 1512 include locally deposited metal on the first and second doped regions 1521, 1522. The first and second doped regions 1521, 1522 can have separation regions 1577 formed there between. In an example, the first and second doped regions 1521, 1522 have trenches formed there between, the trenches extending partially into the substrate, and covered by intervening layer 1562. The trenches can be replaced with intrinsic or lightly doped semiconductor regions.

Figure 8B:
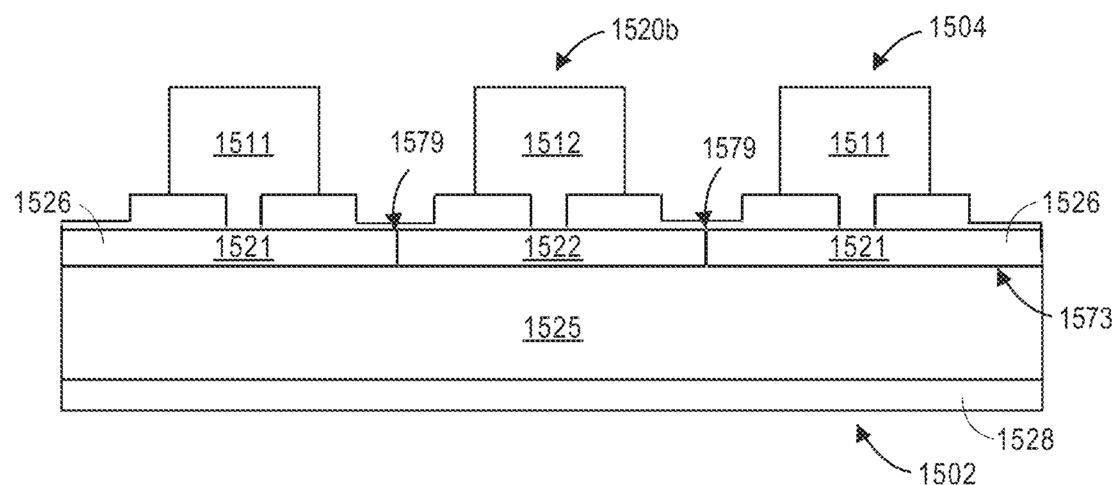

FIG. 8B illustrates another example of a back-contact solar cell 1520*b* fabricated using methods, approaches or equipment described herein, according to some embodiments. The back-contact solar cell 1520*b* can include the first and second doped regions 1521, 1522 disposed on a back side 1504 of a solar cell 1520*b*. In an example, the first and second doped regions 1521, 1522 can be doped semiconductor regions that extend in a continuous layer. In one example, first and second doped regions 1521,1522 are separated by a lightly doped region 1579 there between, e.g., where the lightly doped regions can have a doping concentration substantially less than the first and second doped regions 1521, 1522. In an embodiment, a thin oxide layer 1573 (e.g., tunnel oxide layer) can be disposed between the first and second doped regions 1521, 1522 and the substrate 1525. In a particular embodiment, the first and second doped regions 1521, 1522 can be doped polysilicon regions. The first and second doped regions 1521, 1522 can, instead, be located in the substrate 1525. In an embodiment, conductive contact structures 1511, 1512 on the back side 1504 of the solar cell 1520*c*, where the conductive contact structures 1511, 1512 include locally deposited metal on the first and second doped regions 1521, 1522 formed via a LAMP technique.

Figure 8C:
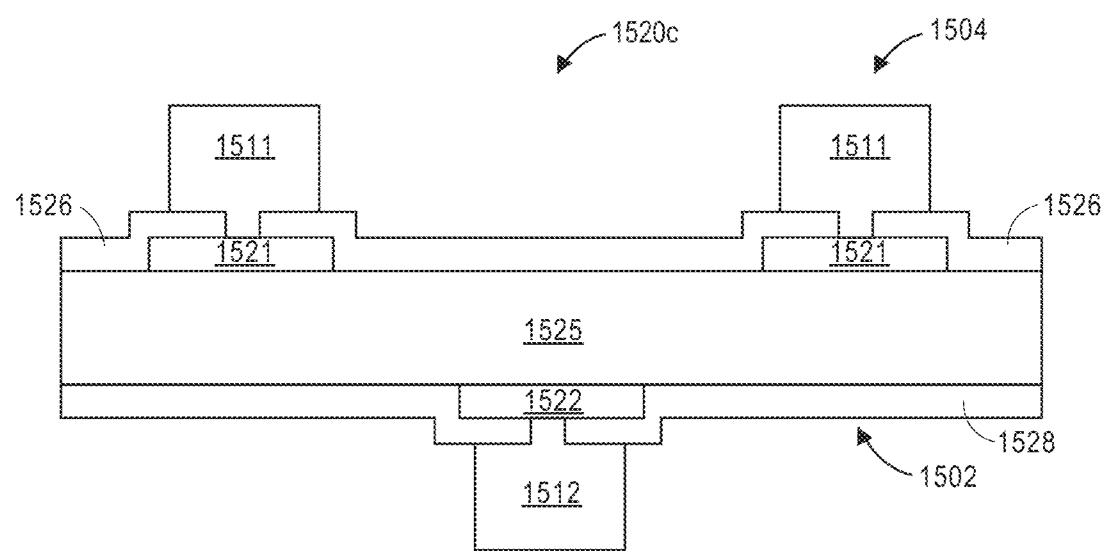

FIG. 8C illustrates an example front-contact solar cell fabricated using methods, approaches or equipment described herein, according to some embodiments. The front-contact solar cell 1520*c* can include the first doped regions 1521 disposed on the back side 1504 of the solar cell 1520*c*. In an example, the second doped region 1522 can be disposed on the front side 1502 of the solar cell 1520*c*. Although one example of a second doped region 1522 is shown, one or more, of the second doped region 1522 can be used. Conductive contact structures 1511, 1512 can be on the front and back sides 1504 of the solar cell 1520*c*, where the conductive contact structures 1511, 1512 include locally deposited metal on the first and second doped regions 1521, 1522 formed via a LAMP technique. The second doped region 1522 can offset from the first doped regions 1521, as shown. The second doped region 1522 can be aligned, e.g., vertically aligned with, the first doped regions 1521.

Figure 8D:
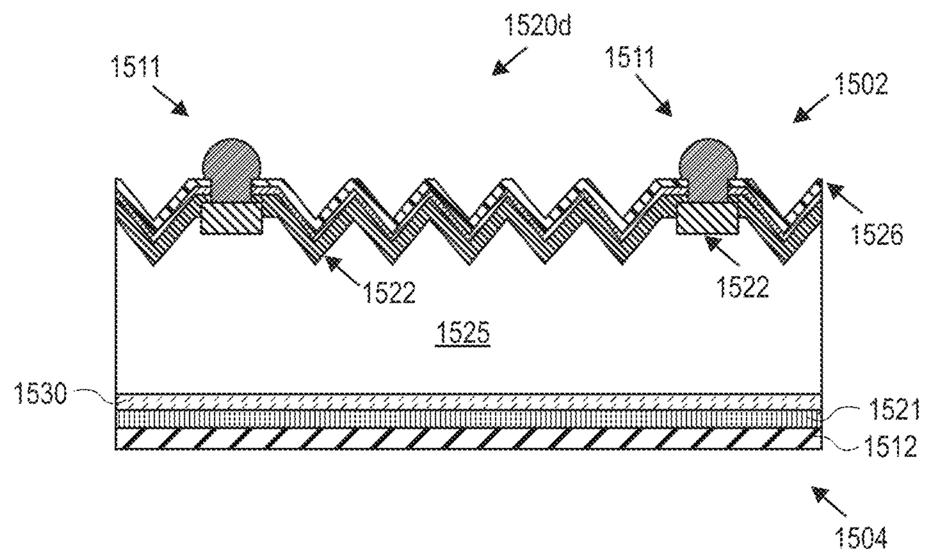

FIG. 8D illustrates an example front-contact solar cell fabricated using methods, approaches or equipment described herein, according to some embodiments. The front-contact solar cell 1520*d* can include the first doped regions 1521 disposed on the back side 1504 of the solar cell 1520*d*. Conductive contact structures 1511, 1512 can be formed via a LAMP technique on the front and back sides 1502, 1504 of the solar cell 1520*d*, respectively, where the conductive contact structures 1511, 1512 include locally deposited metal on the first and second doped regions 1521, 1522. The first and second doped regions 1521, 1522 can include an amorphous silicon region. The solar cell 1520*d* can include an intervening layer (e.g., an anti-reflective layer coating ARC) 1526 on the front side 1502 of the solar cell 1520*d*. The solar cells 1520*d* can include a back intervening layer (e.g., an back anti-reflective coating BARC) 1526 on the back side 1504 of the solar cell 1520*d*. A thin oxide layer 1530 can be disposed between the first doped region 1521 and the substrate 1525.

Figure 8E:
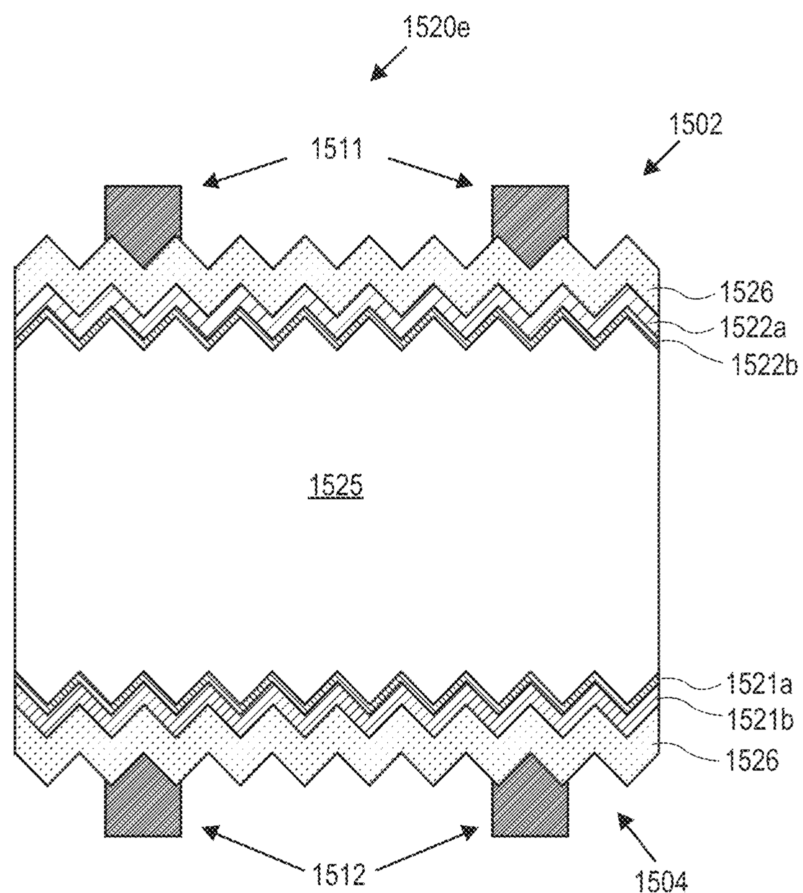

FIG. 8E illustrates another exemplary front-contact solar cell fabricated using methods, approaches or equipment described herein, according to some embodiments. The solar cell 1520*e* can include the first doped regions 1521*a*, 1521*b* disposed on the back side 1504 of the solar cell 1520*e*. In an example, the second doped region 1522*a*, 1522*b* can be disposed on the front side 1502 of the solar cell 1520*d*. In an embodiment, conductive contact structures 1511, 1512 can be formed via a LAMP technique on the front and back sides 1504 of the solar cell 1520*b*, respectively, where the conductive contact structures 1511, 1512 include locally deposited metal on the first and second doped regions 1521*a*, 1521*b*, 1522*a* 1522*b*. The first doped regions 1521*a*, 1521*b* can include a doped polysilicon region. The solar cell 1520*e* can include an intervening layer (e.g., an anti-reflective coating ARC) 1528 on the front side 1502 of the solar cell 1520*e*. The solar cells 1520*e* can include a back intervening layer (e.g., an back anti-reflective coating B ARC) 1526 on the back side 1504 of the solar cell 1520*e*.

As described herein, methods of forming solar strings, solar circuit formation and the like are shown. In embodiments, the metallization processes and structures described herein to create and/or as part of a solar panel, solar module, solar laminate and/or a flexible type solar panel.

Figure 9A:
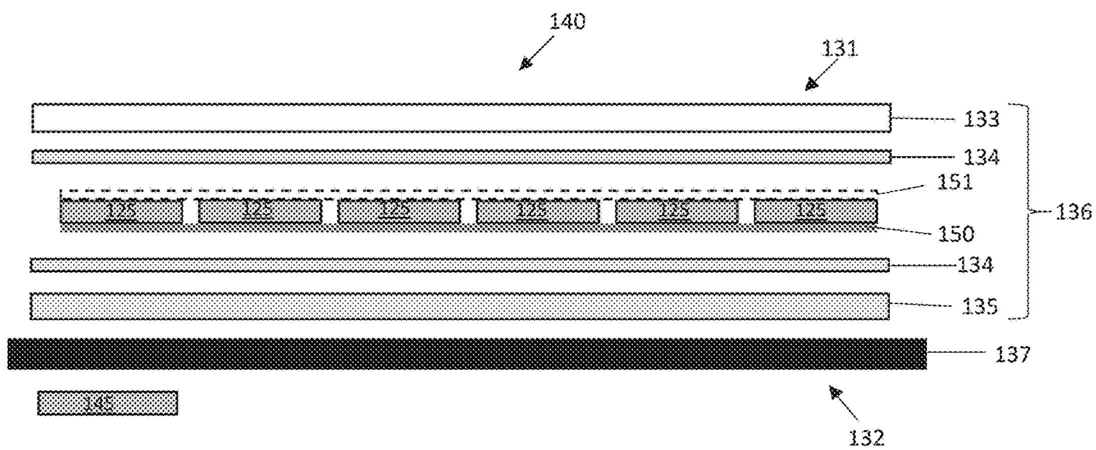
FIGS. 9A and 9B illustrate cross-sectional views of an example solar cell module.

Referring to FIG. 9A, an exploded view of a solar module is presented. Referring again to FIG. 9A, a method of fabricating a solar panel, solar module, solar laminate and/or a flexible type solar panel, is also presented. In an embodiment, the method can include providing semiconductor substrates 125. In an embodiment, the semiconductor substrates 125 can include solar cells (e.g., solar cells described herein). In an embodiment, the method can include locating and/or placing the semiconductor substrates 125 over an encapsulant 134. In an embodiment, the encapsulant 134 can be disposed over a cover layer 133 and/or a backsheet 135. In an embodiment, locating and/or placing the semiconductor substrates 125 can include locating and/or placing the semiconductor substrates over a cover layer 133 and/or a backsheet 135. In an example, locating and/or placing the semiconductor substrates 125 can include locating and/or placing the semiconductor substrates 125 over an encapsulant 133 which, in turn, can be disposed over the cover layer 133 (e.g., in this way, a front side 131 of a solar module 140 would face downward). In one example, locating and/or placing the semiconductor substrates 125 can include locating and/or placing the semiconductor substrates 125 over an encapsulant 133 which, in turn, can be disposed over the backsheet 135. In an embodiment, the process described and conductive contact structures in FIGS. 5A-7 can be formed. In an example, subsequent to placing the semiconductor substrates 125 over the encapsulant 134, cover layer 133 and/or backsheet 135, the process described and conductive contact structures in FIGS. 5A-7 can be formed. In an example, the method can include exposing the metal foil 150 to laser beam over selected portions of the semiconductor substrates 125, wherein exposing the metal foil 150 to the laser beam forms a plurality conductive contact structures having of locally deposited metal portion electrically connecting the metal foil 150 to the semiconductor substrates 125 at the selected portions. In an example, the method can include selectively removing portions of the metal foil 150, wherein remaining portions of the metal foil 150 can extend between at least two of the plurality of semiconductor substrates 125. In an embodiment, metal foil 150 can include a continuous sheet. In an example, the method can include using a continuous sheet (e.g., a continuous sheet of metal foil 150).

Referring again to FIG. 9A, in an embodiment, top and bottom encapsulants 134 can surround the semiconductor substrates 125, e.g., encapsulate the semiconductor substrates 125. In an embodiment, a cover layer 133 can be placed over the encapsulant 134, semiconductor substrates 125, metallization structure 150 and backsheet 135. In an embodiment, placing the cover layer 133 over the encapsulant 134 can include placing glass over the encapsulant 134. In an embodiment, the encapsulant 134 can include ethylene vinyl acetate (EVA), polyolefin and/or other encapsulant materials. In an embodiment, a lamination process and/or a thermal process can be performed to form a solar laminate 136. In an embodiment, the solar laminate can include the cover layer 133, encapsulant 134, semiconductor substrates 125, metallization structure 150 and backsheet 135. In one example, the lamination process and/or a thermal process can include heating the encapsulant 134 and semiconductor substrates 125 and metallization structure 150. In an example, the cover layer 133, encapsulant 134, semiconductor substrates 125, metallization structure 150 and backsheet 135 can undergo a lamination and/or a thermal process to form the solar laminate 136. In an embodiment, the solar laminate can be placed in a frame 137. In an embodiment, a junction box 145, e.g., a box including bypass diodes, micro-inverters and/or other electronics can be attached to the frame 137. Thus, in an embodiment a solar module 140 can be formed. In an embodiment, the solar module 140 can have a front side 131, e.g., which faces the sun during normal operation, and back side 132 which is opposite the front side 131. Although as shown, a solar laminate is enclosed or is part of the solar module 140, in some products the solar laminate can be formed on its own (e.g., the solar laminate can be its own product). In an example, a flexible type solar panel can include the solar laminate 136 (e.g., without the frame 137). As shown, the metallization structure 150 can be placed below, e.g., on back sides of the semiconductor substrates 125 (e.g., back sides of solar cells). In another embodiment, a metallization structure 151 can instead be placed on the front sides of the semiconductor substrates 125 (e.g., front sides of solar cells).

Figure 9B:
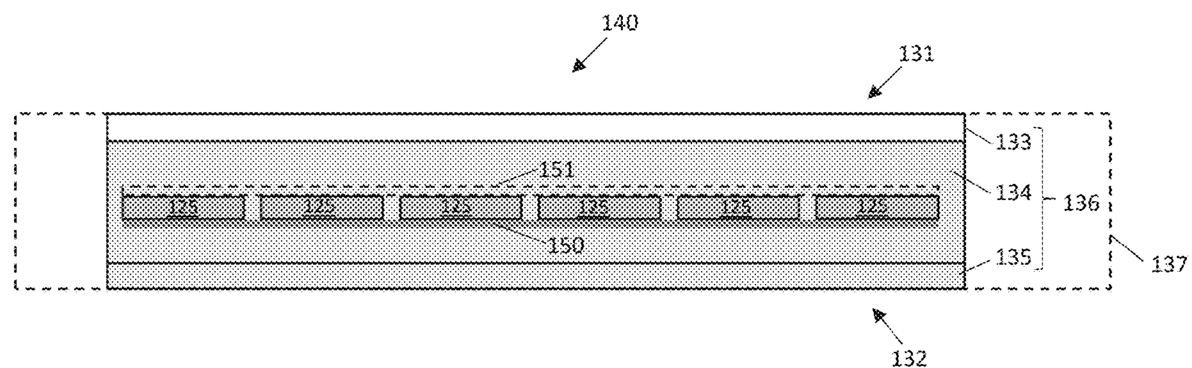

Referring to FIG. 9B, a solar panel, solar module, solar laminate and/or a flexible type solar panel and/or laminate formed from the methods described in FIGS. 5A-7 is presented. In an embodiment, the solar module 140 can have a front side 131, e.g., which faces the sun during normal operation, and back side 132 which is opposite the front side 131. In an embodiment, the solar module 140 can include a solar laminate 136. In an embodiment, the solar laminate can include a cover layer 133, encapsulant 134, semiconductor substrates 125, metallization structure 150 and backsheet 135. In an embodiment, the metallization structures 150/151 can include the structures described in FIGS. 5A-7 (e.g., metal foil, conductive contact structures including locally deposited metal). In an embodiment, metallization structures 150 can include one or more conductive contact structures including locally deposited metal portions electrically connected to the back sides the semiconductor substrates 125. In an embodiment, the metallization structures 150 can include interconnect portions located on and extending between semiconductor substrates 125. In an embodiment, the interconnect portions can be disposed over the back sides of the semiconductor substrates 125. In an example, the semiconductor substrates can include a plurality of semiconductor substrates 125 (e.g., first semiconductor substrates, second semiconductor substrates) and each of the substrates can include front sides and back sides. In an example, one or more conductive contact structures including locally deposited metal portions electrically connected to the first side (either a front side, a back side, or both sides) of a first semiconductor substrate and interconnect portions of the metal structure can be located on and extending between the first semiconductor substrate and a second semiconductor substrate, where the interconnect portions can be disposed over the back sides of the first and second semiconductor substrates. In an embodiment, the semiconductor substrates 125 comprise solar cells. In an embodiment, at least a portion of the semiconductor substrates 125 are arranged in parallel or in series. In an embodiment, at least a portion of the semiconductor substrates 125 are arranged as a string of solar cells. In an embodiment, at least a portion of the semiconductor substrates 125 are arranged as an array of solar cell strings. In an embodiment, the encapsulant 134 can include ethylene vinyl acetate (EVA), polyolefin and/or other encapsulant materials. Although as shown, a solar laminate 136 is enclosed or part of the solar module 140, in some products the solar laminate 136 can formed and sold separately (e.g., as a separate product). In an example, a flexible type solar panel can include the solar laminate 136 (e.g., without the frame 137). Also, although not shown, one or more junction boxes can be located as part of the solar module 140, connected to the frame 137 or connected to the solar laminate 136.

Figure 10A:
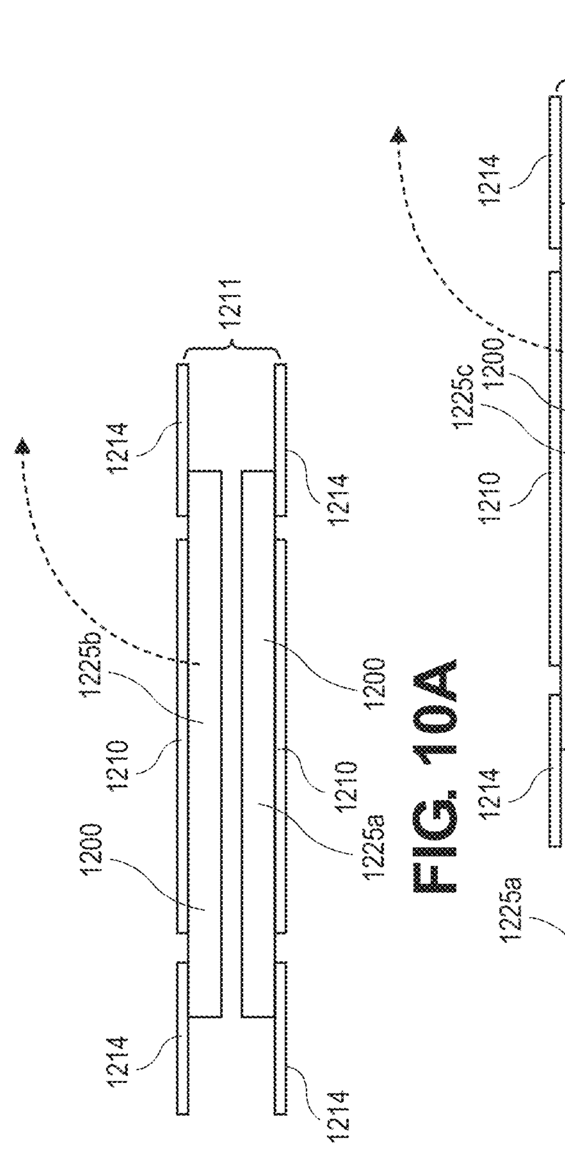
FIGS. 10A-10C illustrate side views of operations in a method of fabricating a solar cell string.
Figure 10B:
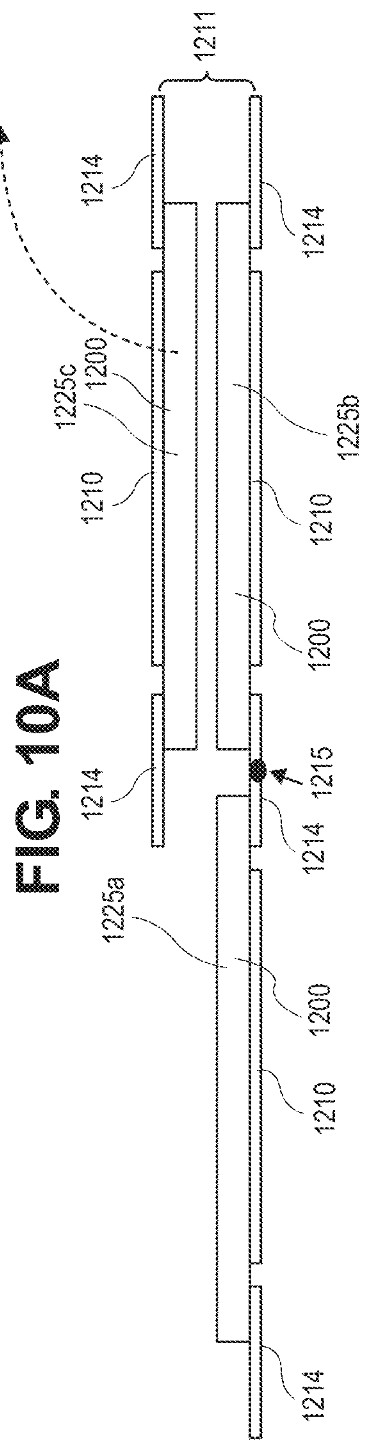
Figure 10C:
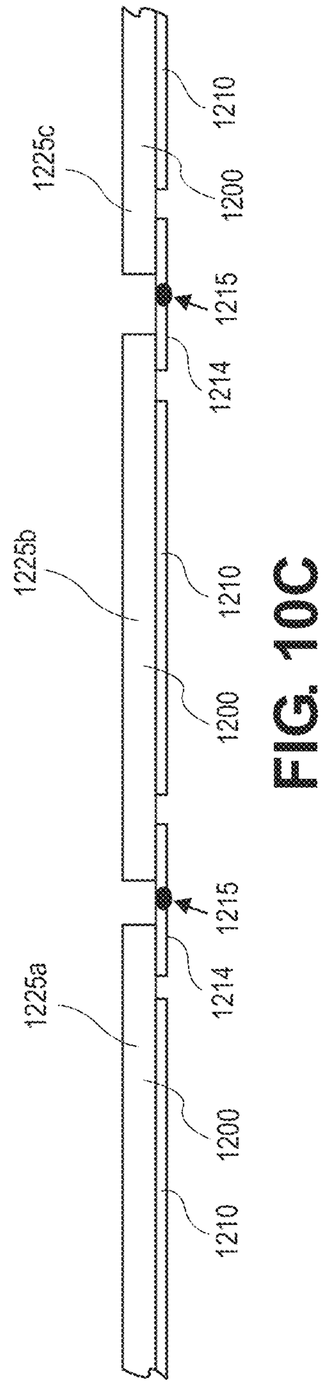

FIGS. 10A-10C illustrate side views of operations in a method of fabricating a solar cell string. Referring to FIG. 10A, two solar cells 1225*a* and 1225*b* including substrates 1200 are provided. The substrates include a plurality of conductive contact structures 1210 electrically connected to the substrates 1200 and second portions 1214 of the metal foil 1206 not exposed to the laser beam 1208 are retained on the substrates 1200, overhanding and/or extending from the substrates 1200. While conductive contact structures 1210 and second portions 1214 are show as separated they can be continuous. The solar cells 1225*a* and 1225*b* are stacked together with the conductive contact structures 1210 on the exterior of the stack. The second portions 1214 are bonded together at position 1211 to form a bond 1215 as shown in FIG. 10B. In an embodiment, the bonding can be done by a laser process as described herein. In an embodiment, the bonding is a welding process, such as laser welding, ultrasonic welding, or induction welding. In embodiment, the bond can be formed by thermocompression bonding. In an embodiment, the bonding is accomplished with a conductive adhesive. Two solar cells can be attached using this process as well. The solar cells 1225*a* and 1225*b* can be unfolded as depicted by the arrow to form a linear string. As shown in FIG. 10B that process can be repeated multiple times to create an almost limitless string, such as by adding solar cell 1225*c* as depicted in FIG. 10B. Although, there are 3 solar cells shown in FIG. 10C, there can be 2, 3, 4, 5, 6, or more solar cells connected in a solar cell string. In addition different procedures and steps can be performed to form the solar cell strings shown. In an embodiment strings of solar cells can be connected together by stacking the strings together, for example with their front sides facing, and bonding the metal foil extending from one solar cell at the end of a first solar cell string to a complementary metal foil extending from a solar cell at the end of a second solar string that is stacked over the first solar cell string.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. In another embodiment, any type of substrate used in the fabrication of micro-electronic devices can be used instead of a silicon substrate, e.g., a printed circuit board (PCB) and/or other substrates can be used. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Additionally, although solar cells are described in great detail herein, the methods and/or processes described herein can apply to various substrates and/or devices, e.g., semiconductor substrates. For example, a semiconductor substrate can include a solar cell, light emitting diode, microelectromechanical systems and other substrates.

Furthermore, although many embodiments described pertain to directly contacting a semiconductor with a metal foil as a metal source. Concepts described herein can also be applicable to solar applications (e.g., HIT cells) where a contact is made to a conductive oxide, such as indium tin oxide (ITO), rather than contacting a semiconductor directly. Additionally, embodiments can be applicable to other patterned metal applications, e.g., PCB trace formation.

Thus, local metallization of semiconductor substrates using a laser beam, and the resulting structures are presented.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A method of fabricating a solar cell string, comprising:

locating a metal foil over a plurality of semiconductor substrates;

exposing the metal foil to a laser beam over selected portions of the plurality of semiconductor substrates to form a plurality of conductive contact structures, one or more of the plurality of conductive contact structures having a discrete locally deposited metal portion electrically connected to one of the semiconductor substrates at one of the selected portions, wherein the discrete locally deposited metal portion of each of the one or more of the plurality of conductive contact structures is formed from the metal foil and is separated from a non-exposed portion of the metal foil that is not exposed to the laser beam such that the discrete locally deposited metal portion is not connected to the non-exposed portion of the metal foil that is not exposed to the laser beam; and subsequent to exposing the metal foil to the laser beam, selectively removing portions of the non-exposed portion of the metal foil, such that remaining portions of the non-exposed portion of the metal foil span one or more gaps between at least two of the plurality of semiconductor substrates, wherein the non-exposed portion of the metal foil that spans the one or more gaps between at least two of the plurality of semiconductor substrates is coupled to the at least two of the plurality of semiconductor substrates without a weld.

2. The method of claim 1, wherein the metal foil comprises a continuous sheet.

3. The method of claim 1, wherein the semiconductor substrates each comprise N-type and P-type semiconductor regions.

4. The method of claim 1, further comprising, forming a plurality of N-type and P-type semiconductor regions in or above the plurality of semiconductor substrates.

5. The method of claim 1, further comprising;

electrically connecting one or more junction boxes to the metal foil and/or diodes to the metal foil.

6. The method of claim 1, wherein at least a portion of the solar cell string is arranged as a parallel circuit, series circuit, or a combination thereof.

7. The method of claim 3, further comprising:

exposing the metal foil to a laser beam in locations over N-type and P-type semiconductor regions to form a plurality of conductive contact structures electrically connected to the plurality of N-type and P-type semiconductor regions, each conductive contact structure comprising a locally deposited metal portion.

8. The method of claim 1, wherein the metal foil is a first metal foil, the method further comprising:

locating a second metal foil over the first metal foil; and bonding the second metal foil over selected portions of the first metal foil to electrically connect the second metal foil to the first metal foil at the selected portions.

9. A solar cell string, comprising:

a plurality of semiconductor substrates;

a metal foil located on and extending between a first semiconductor substrate and a second semiconductor substrate, wherein the metal foil is disposed over a first side of the first semiconductor substrate and over a first side of the second semiconductor substrate, wherein the portion of the metal foil extending between the first semiconductor substrate and the second semiconductor substrate is coupled to the first semiconductor substrate and to the second semiconductor substrate without a weld;

one or more conductive contact structures each including a discrete locally deposited metal portion electrically connected to the first side of the first semiconductor substrate, wherein the discrete locally deposited metal portion of each of the one or more conductive contact structures is formed from the metal foil and is separated from an entirety of the metal foil such that the discrete locally deposited metal portion is not connected to the entirety of the metal foil; and one or more conductive contact structures each including a discrete locally deposited metal portion electrically connected to the first side of the second semiconductor substrate, wherein the discrete locally deposited metal portion of each of the one or more conductive contact structures is formed from the metal foil and is separated from an entirety of the metal foil such that the discrete locally deposited metal portion is not connected to the entirety of the metal foil.

10. The solar cell string of claim 9, further comprising, one or more junction boxes electrically connected to the metal foil and/or bypass diodes electrically connected to the metal foil.

11. The solar cell string of claim 9, wherein at least a portion of the solar cell string is arranged in parallel or in series.

12. The solar cell string of claim 9, wherein at least a portion of the plurality of semiconductor substrates are arranged as a string of solar cells.

13. The solar cell string of claim 9, wherein at least a portion of the plurality of semiconductor substrates are arranged as an array of solar cell strings.

14. The solar cell string of claim 13, wherein the semiconductor substrates each comprise N-type and P-type semiconductor regions.

15. The solar cell string of claim 14, further comprising a plurality of conductive contact structures electrically connected to the plurality of N-type and P-type semiconductor regions, each conductive contact structure comprising a locally deposited metal portion disposed in direct contact with a corresponding one of the N-type and P-type semiconductor regions.

16. A method of fabricating solar laminate, comprising:

locating a metal foil over a plurality of semiconductor substrates;

exposing the metal foil to a laser beam over selected portions of the plurality of semiconductor substrates to form a plurality of conductive contact structures, one or more of the plurality of conductive contact structures having a discrete locally deposited metal portion electrically connected to one of the semiconductor substrates at one of the selected portions, wherein the discrete locally deposited metal portion of each of the one or more of the plurality of conductive contact structures is non-continuous with and is formed from the metal foil and is separated from a non-exposed portion of the metal foil that is not exposed to the laser beam such that the discrete locally deposited metal portion is not connected to the non-exposed portion of the metal foil that is not exposed to the laser beam;

subsequent to exposing the metal foil to the laser beam, selectively removing portions of the non-exposed portion of the metal foil, such that remaining portions of the non-exposed portion of the metal foil span one or more gaps between at least two of the plurality of semiconductor substrates, wherein the non-exposed portion of the metal foil that spans the one or more gaps between at least two of the plurality of semiconductor substrates is coupled to the at least two of the plurality of semiconductor substrates without a weld;

placing an encapsulant over the semiconductor substrates; and performing a thermal process to form the solar laminate.

17. The method of claim 16, wherein the metal foil comprises a continuous sheet.

18. The method of claim 16, wherein the semiconductor substrates each comprise solar cells.

19. The method of claim 16, wherein the semiconductor substrates each comprise N-type and P-type semiconductor regions.

20. The method of claim 1, further comprising removing second non-exposed portions of the metal foil that are between regions of the conductive contact structures on the substrates by tearing the metal foil along perforations created by the exposing between the conductive contact structures and the second non-exposed portions.

* * * * *